US011810626B2

(12) United States Patent
Rehani et al.

(10) Patent No.: US 11,810,626 B2
(45) Date of Patent: Nov. 7, 2023

(54) GENERATING BOOSTED VOLTAGES WITH A HYBRID CHARGE PUMP

(71) Applicant: SanDisk Technologies LLC, Addison, TX (US)

(72) Inventors: Ankit Rehani, Burari (IN); V. S. N. K. Chaitanya G., Bengaluru (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/670,317

(22) Filed: Feb. 11, 2022

(65) Prior Publication Data
US 2023/0260580 A1   Aug. 17, 2023

(51) Int. Cl.
*H02M 3/07*      (2006.01)
*G11C 16/30*     (2006.01)
*G11C 16/26*     (2006.01)
*G11C 16/04*     (2006.01)
*H10B 43/27*     (2023.01)

(52) U.S. Cl.
CPC .......... *G11C 16/30* (2013.01); *G11C 16/0483* (2013.01); *G11C 16/26* (2013.01); *H02M 3/07* (2013.01); *H10B 43/27* (2023.02)

(58) Field of Classification Search
CPC ...................................................... H02M 3/07
See application file for complete search history.

(56) References Cited

U.S. PATENT DOCUMENTS

| 6,351,179 | B1* | 2/2002 | Ikehashi | G05F 1/465 |
| | | | | 327/540 |
| 6,922,096 | B2 | 7/2005 | Cernea | |
| 8,395,434 | B1 | 3/2013 | Nguyen | |
| 8,995,175 | B1 | 3/2015 | Liu | |
| 9,385,596 | B1 | 7/2016 | Yang | |
| 10,847,227 | B2 | 11/2020 | Tran | |
| 2007/0069803 | A1* | 3/2007 | Yamamoto | H02M 3/07 |
| | | | | 327/536 |
| 2009/0160532 | A1* | 6/2009 | Wu | H02M 3/073 |
| | | | | 327/536 |
| 2013/0234768 | A1* | 9/2013 | Murata | G11C 5/145 |
| | | | | 327/170 |
| 2014/0269049 | A1* | 9/2014 | Tran | H02M 3/073 |
| | | | | 327/536 |

FOREIGN PATENT DOCUMENTS

CN       108282083       7/2018

* cited by examiner

*Primary Examiner* — Sibin Chen
(74) *Attorney, Agent, or Firm* — Hector A. Agdeppa; SHEPPARD, MULLIN, RICHTER & HAMPTON LLP

(57) ABSTRACT

A hybrid charge pump is disclosed that employs novel arrangements of depletion-mode n-channel semiconductor devices and enhancement-mode p-channel semiconductor devices that eliminate or otherwise substantially reduce voltage drops that would otherwise occur across semiconductor device arrangements in existing charge pumps. As a result, the hybrid charge pump disclosed herein achieves the same output voltages as conventional charge pumps while requiring a reduced physical die area. Additionally, a hybrid charge pump arrangement disclosed herein employs a novel clocking scheme that reduces or eliminates reverse currents in the hybrid charge pump arrangement.

20 Claims, 17 Drawing Sheets

GENERATING BOOSTED VOLTAGES WITH A HYBRID CHARGE PUMP

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

NAND-type flash memories may employ charge pumps configured to apply bias voltage levels to NAND arrays to perform erase, program, and read operations. Charge pumps generally occupy significant real estate on a NAND flash memory die, thereby limiting the real estate that is available for the NAND arrays and other components.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
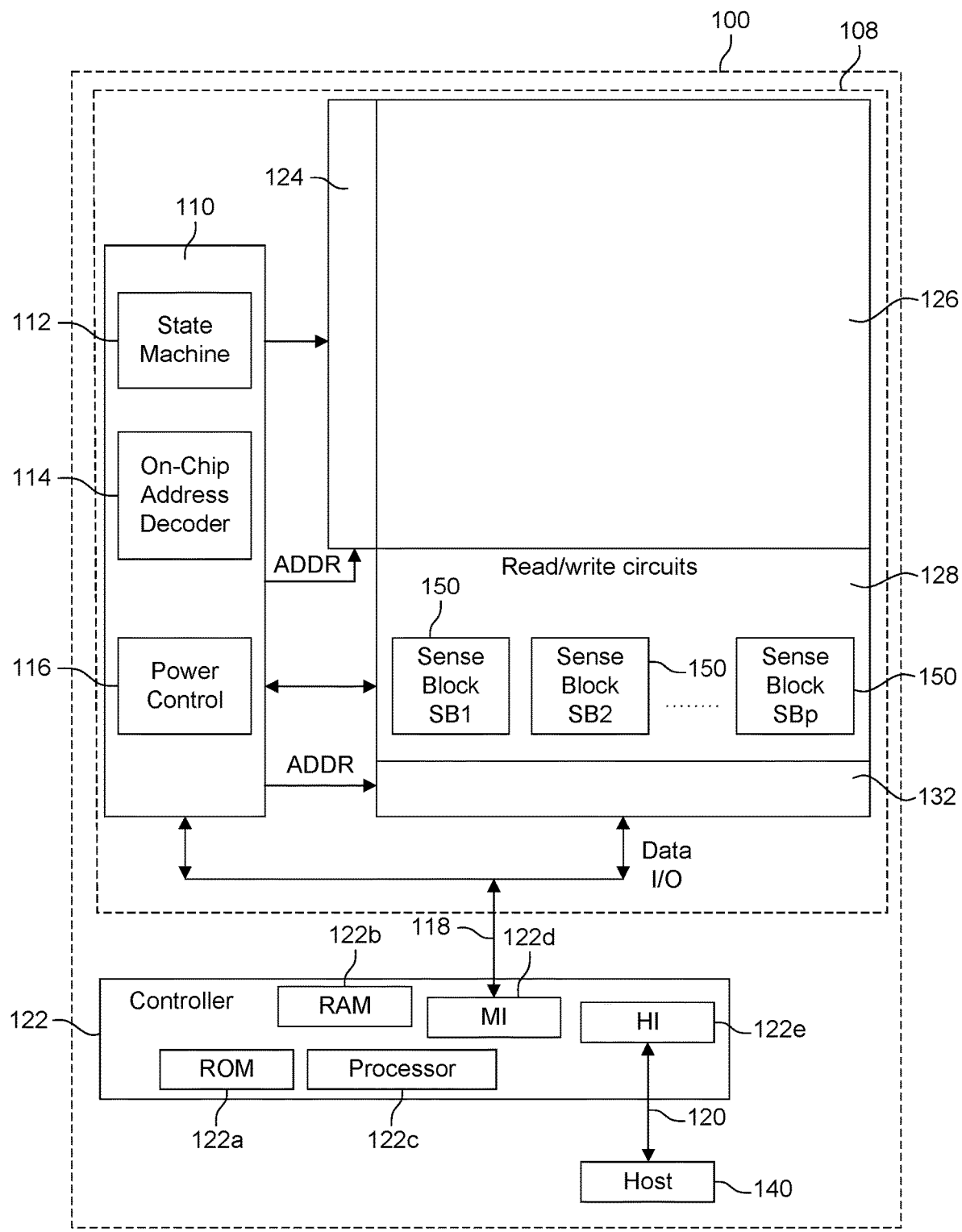
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Charge pumps are important building blocks for NAND-type flash memories (also referred to herein as flash memories). Charge pumps are generally employed to provide appropriate bias voltage levels to NAND arrays via one or more bias voltage generators to enable various operations, such as erase, program, and read operations. Specifically, charge pumps may be used to generate the appropriate bias voltage levels by boosting a lower external voltage to a higher voltage level. Charge pumps may include various components that may cumulatively occupy a significant amount of chip area on a memory die that also includes the NAND flash array. For example, in certain types of flash memory, a charge pump that generates word line (WL) bias voltages may utilize 3.6 square millimeters ($mm^2$) of area on the die. This, in turn, may correspond to approximately 7% of the total die area. As flash memory continues to advance and the number of WLs increases, for example, to accommodate more storage capacity, the area of the flash memory die dedicated to the charge pump may further increase to account for an increased load on the charge pump. Further, dedication of a greater portion of die area to the charge pump can limit the ability to reduce the overall flash memory size and hinder attempts at further reduction of component size. As such, as the area utilized by the charge pump grows with advances in flash memory storage capability, an amount of die area available for corresponding NAND arrays may correspondingly and counterproductively decrease. Hence, it is desirable to reduce or limit the physical area that the charge pump consumes on the die in order to, for example, increase memory densities for flash memories.

A charge pump may operate as a two-phase charge pump that includes two charge pump circuits, one that charges a charge storage device used to boost or kick an input voltage, and one that boosts or kicks the input voltage based the stored charge in the charge storage device. Further details regarding the operation of a two-phase charge pump are provided below with reference to FIGS. 2 and 3. In some scenarios, a charge pump may experience a voltage drop across one or more semiconductor devices that form at least part of the charge pump, such as diode-connected transistors. For example, a charge pump charged with some voltage may experience a voltage drop across a corresponding semiconductor device through which a capacitor (or a similar charge storage device) of the charge pump is charged. This voltage drop across the semiconductor device may reduce a total output voltage generated by the charge pump. For example, when the charge pump is charged to a charged voltage, the output voltage of the charge pump may equal a difference between the charged voltage and the voltage drop. The output voltage of the charge pump is generally related to a size or area of the charge pump. Thus, the voltage drop introduced by the semiconductor device may necessitate a more powerful, and thus, physically larger charge pump to generate a same output voltage that would be generated if the voltage drop was not present. Furthermore, such voltage drops can be more pronounced if, for example, the charge pump is a multi-phase charge pump.

Aspects of the disclosed technology improve upon (e.g., reduce or eliminate) the above-described voltage drop across semiconductor devices of a charge pump by employing arrangements of depletion-mode n-channel metal-oxide-semiconductor (NMOS) and enhancement-mode p-channel metal-oxide-semiconductor (PMOS) semiconductor devices in place of enhancement-mode NMOS or a combination of enhancement-mode NMOS and PMOS devices. For example, in an aspect of the disclosed technology, a combination of enhancement-mode NMOS devices that introduce voltage drops in a charge pump is replaced with a combination of a depletion-mode NMOS device and an enhancement-mode PMOS device, thereby providing a hybrid charge pump. Additionally, this hybrid charge pump arrangement may employ a clocking scheme that reduces or eliminates reverse currents in the hybrid charge pump arrangement. By utilizing a novel and improved arrangement of charge pump components and control scheme, aspects of the disclosed technology provide a hybrid charge pump design that reduces a physical die area of the hybrid charge pump as compared to an existing non-hybrid charge pump, while at the same time, providing similar or higher output voltages than the non-hybrid charge pump, thereby providing a technical solution to technical problems associated with the existing non-hybrid charge pump design.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
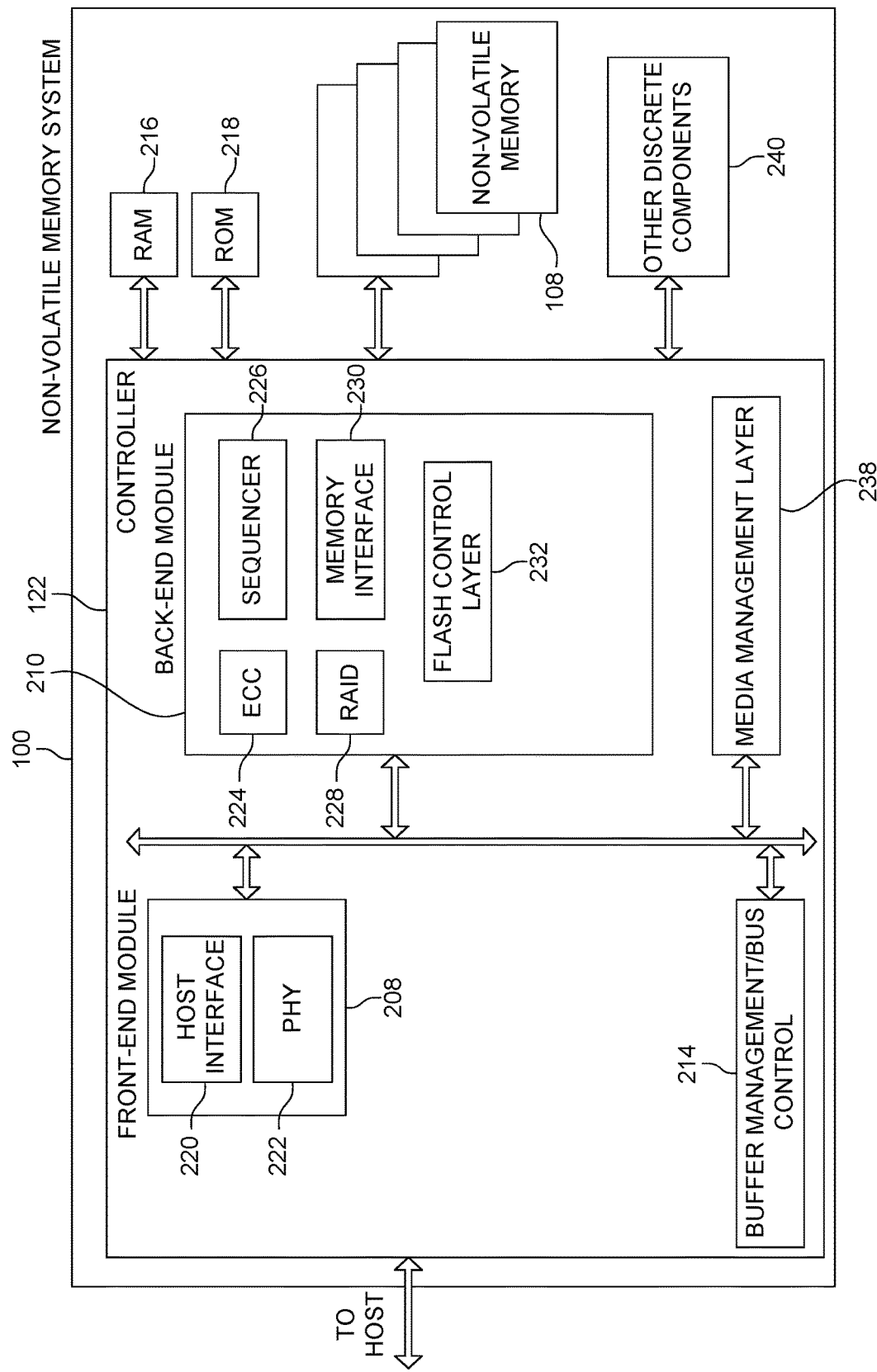
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
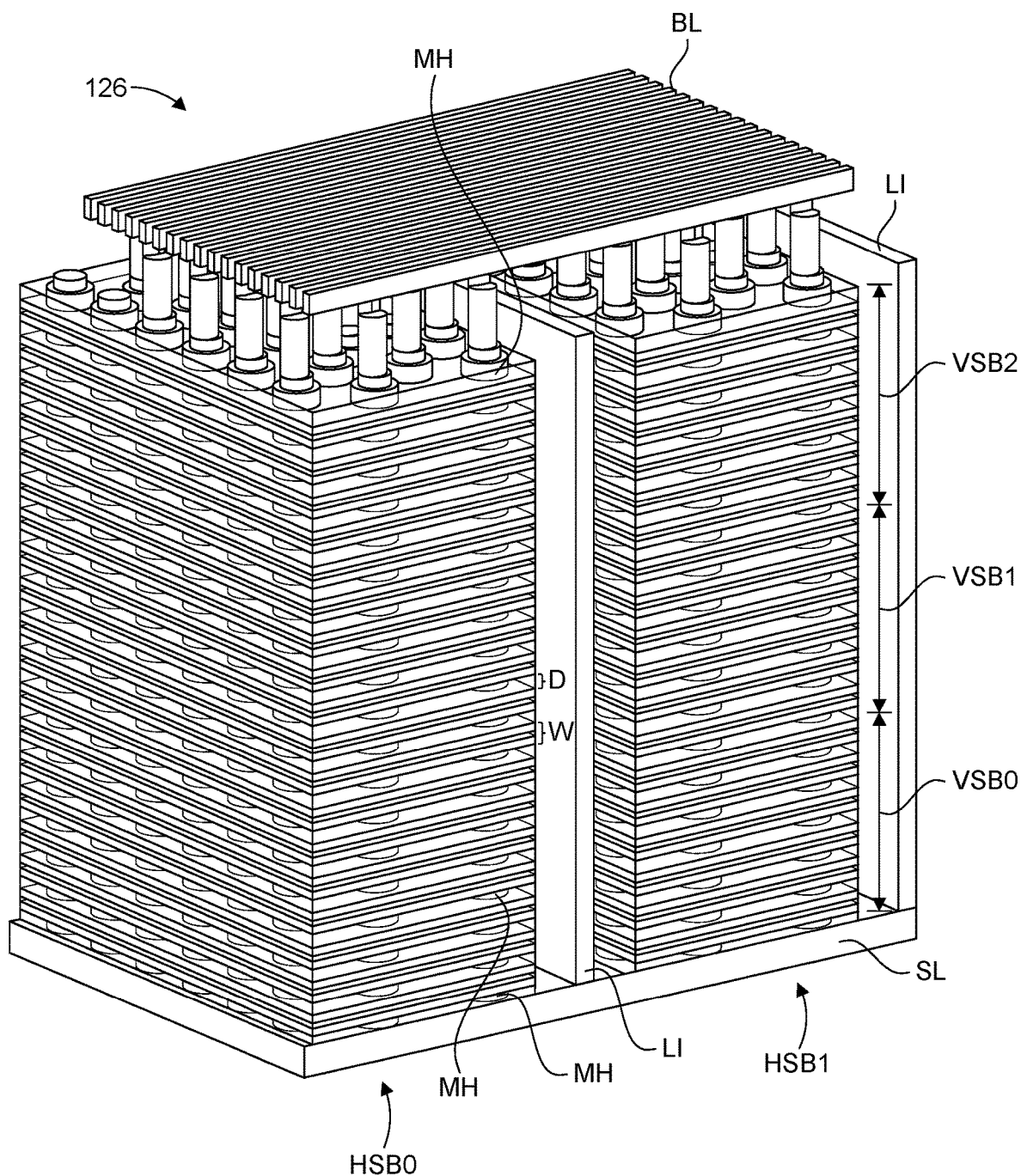
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
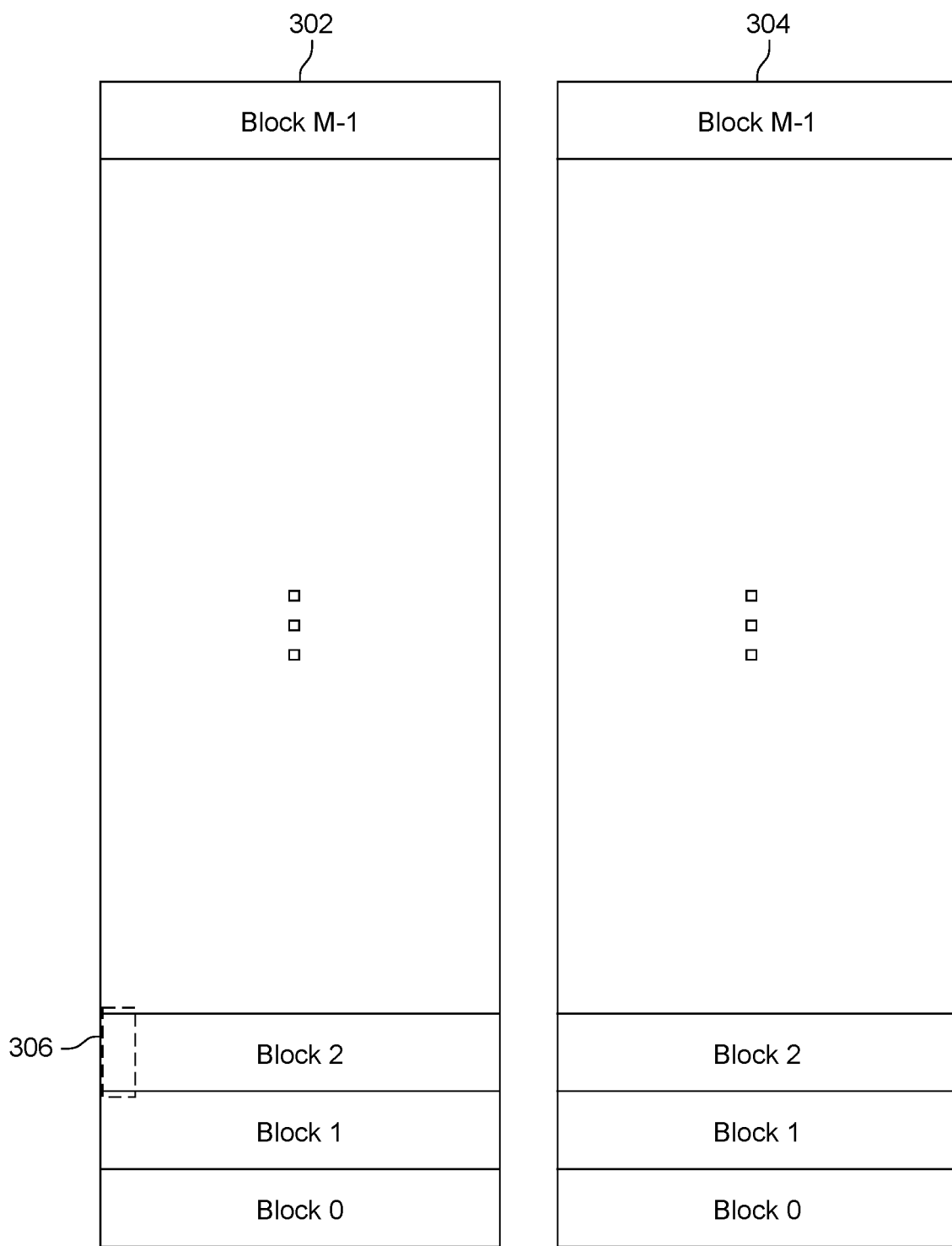
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
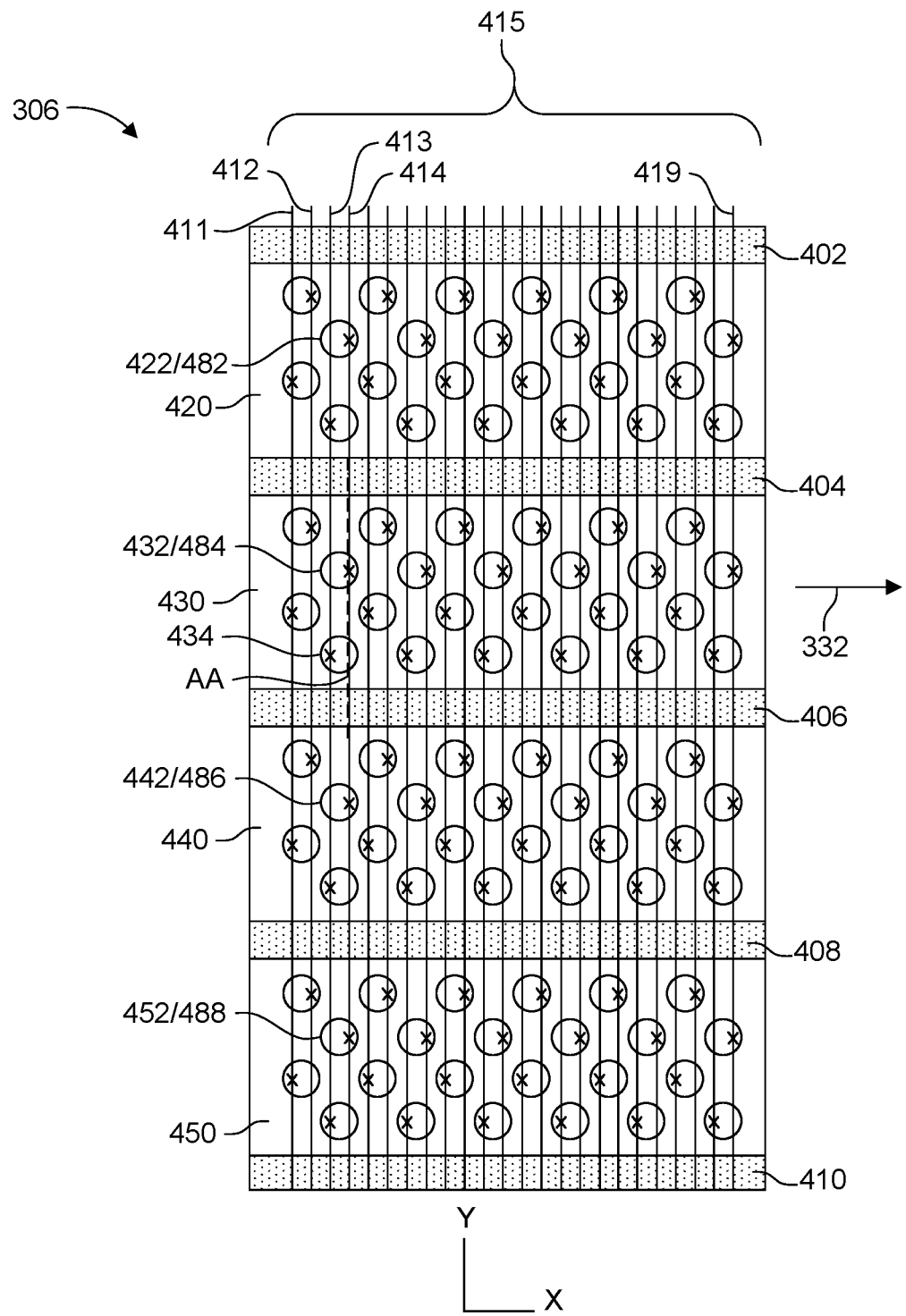
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
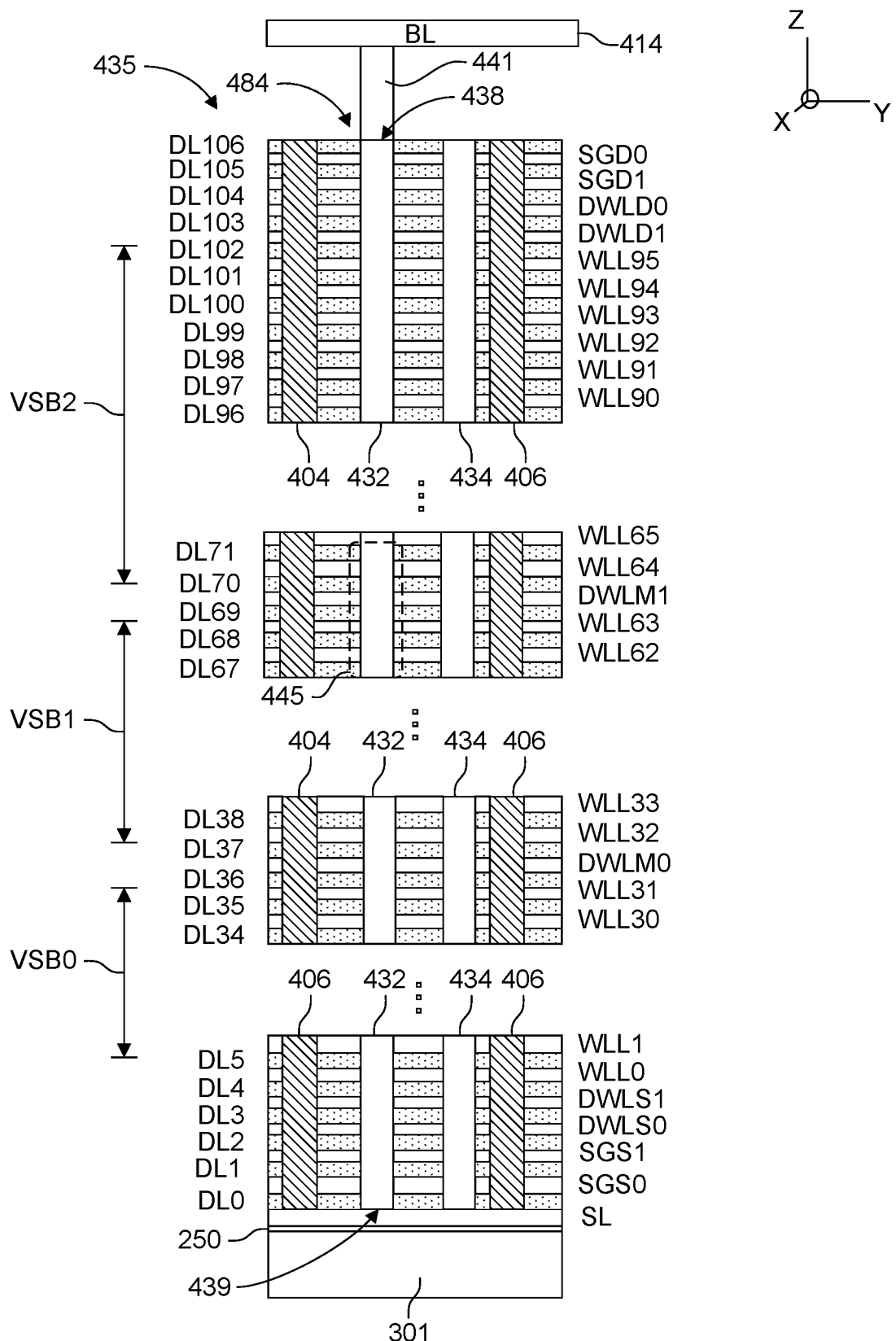
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
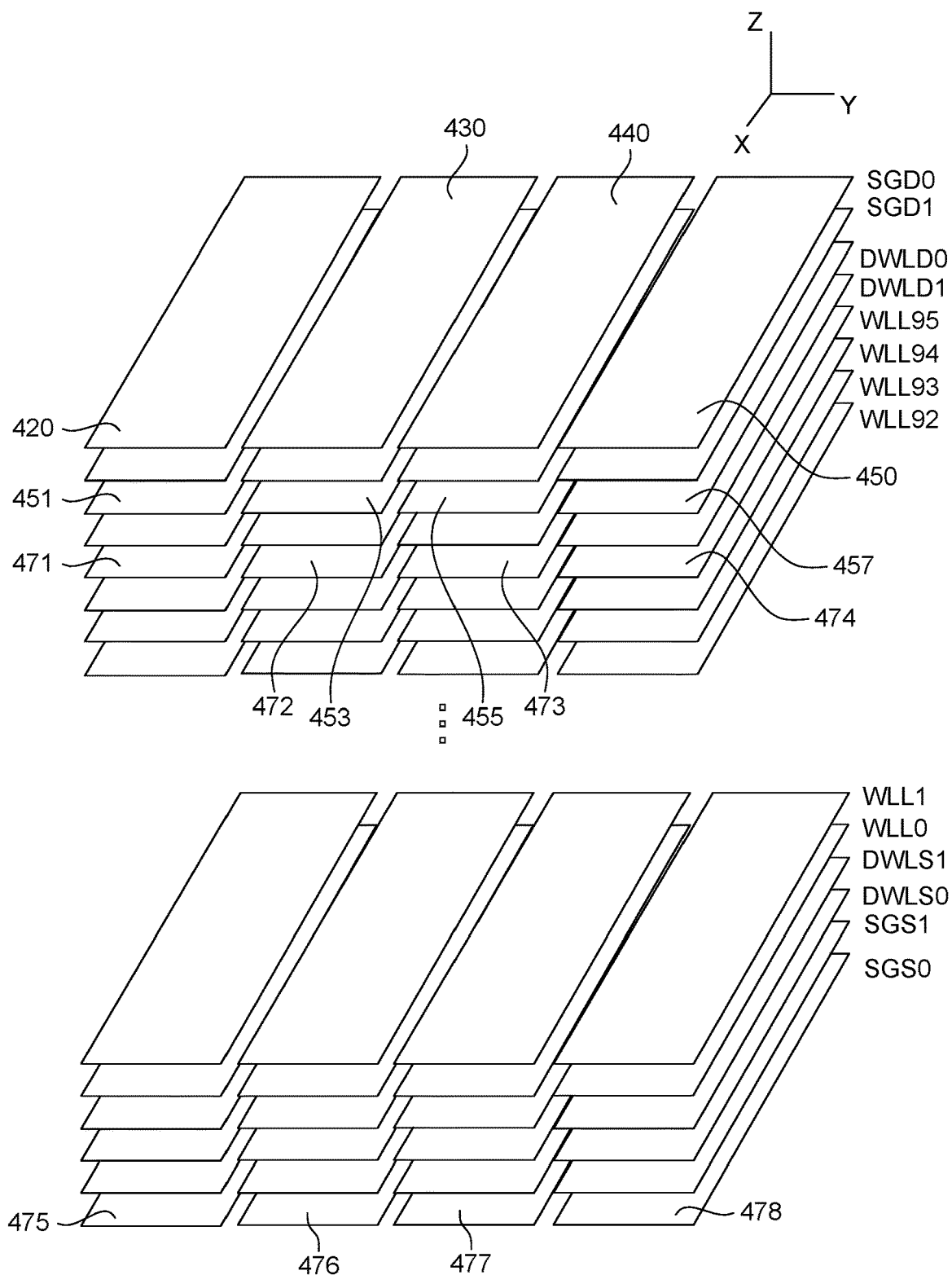
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD0 layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
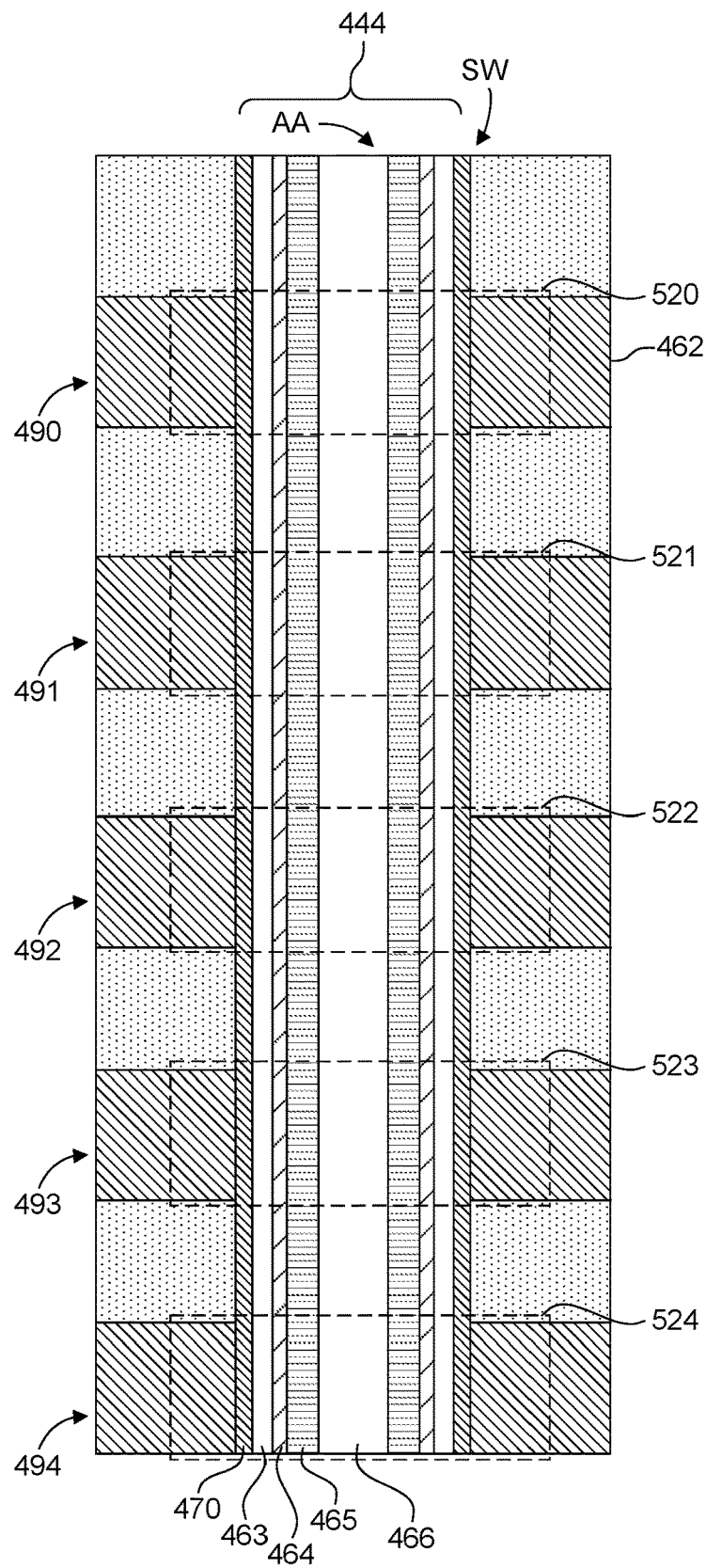
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
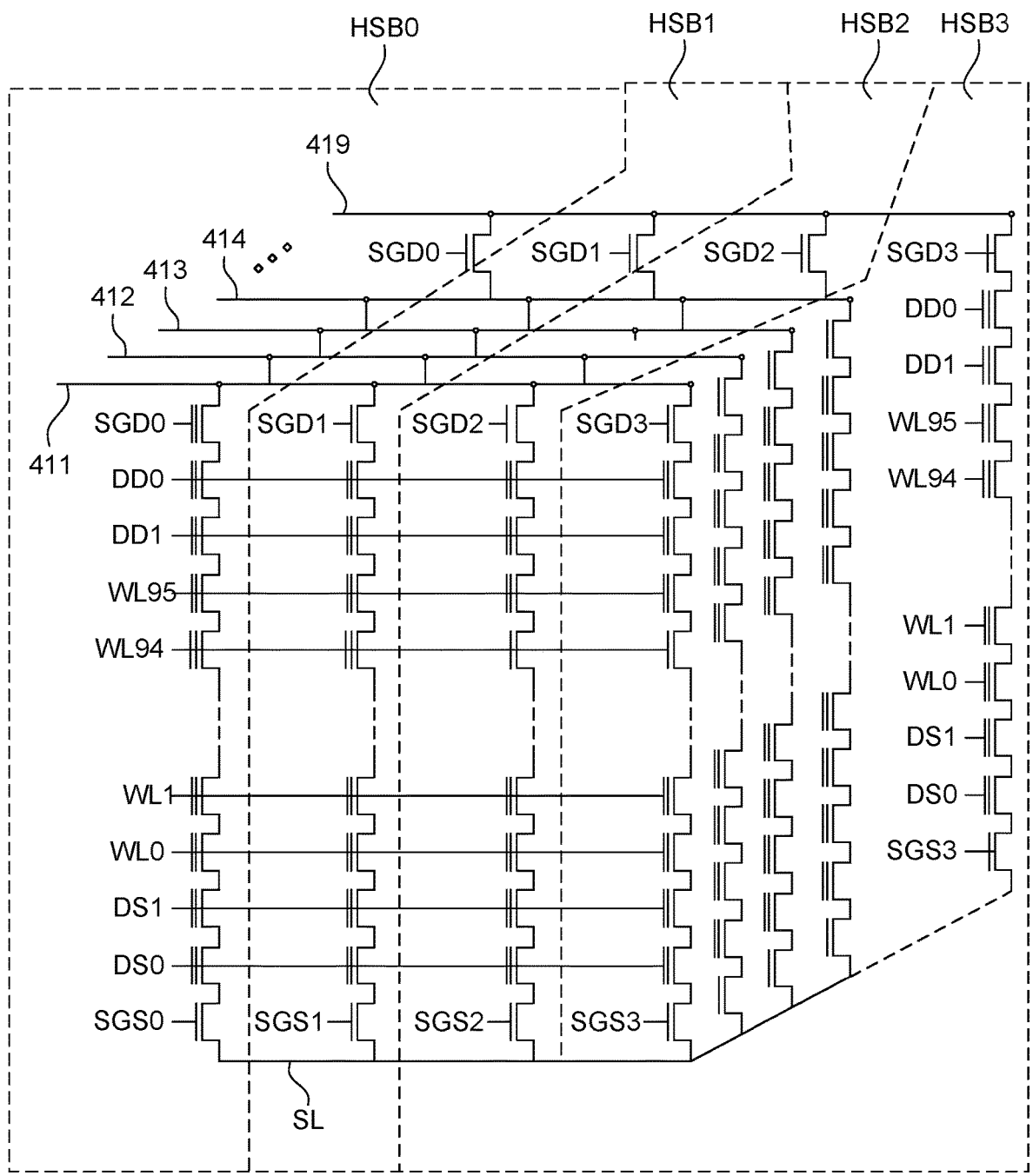
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, ... 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
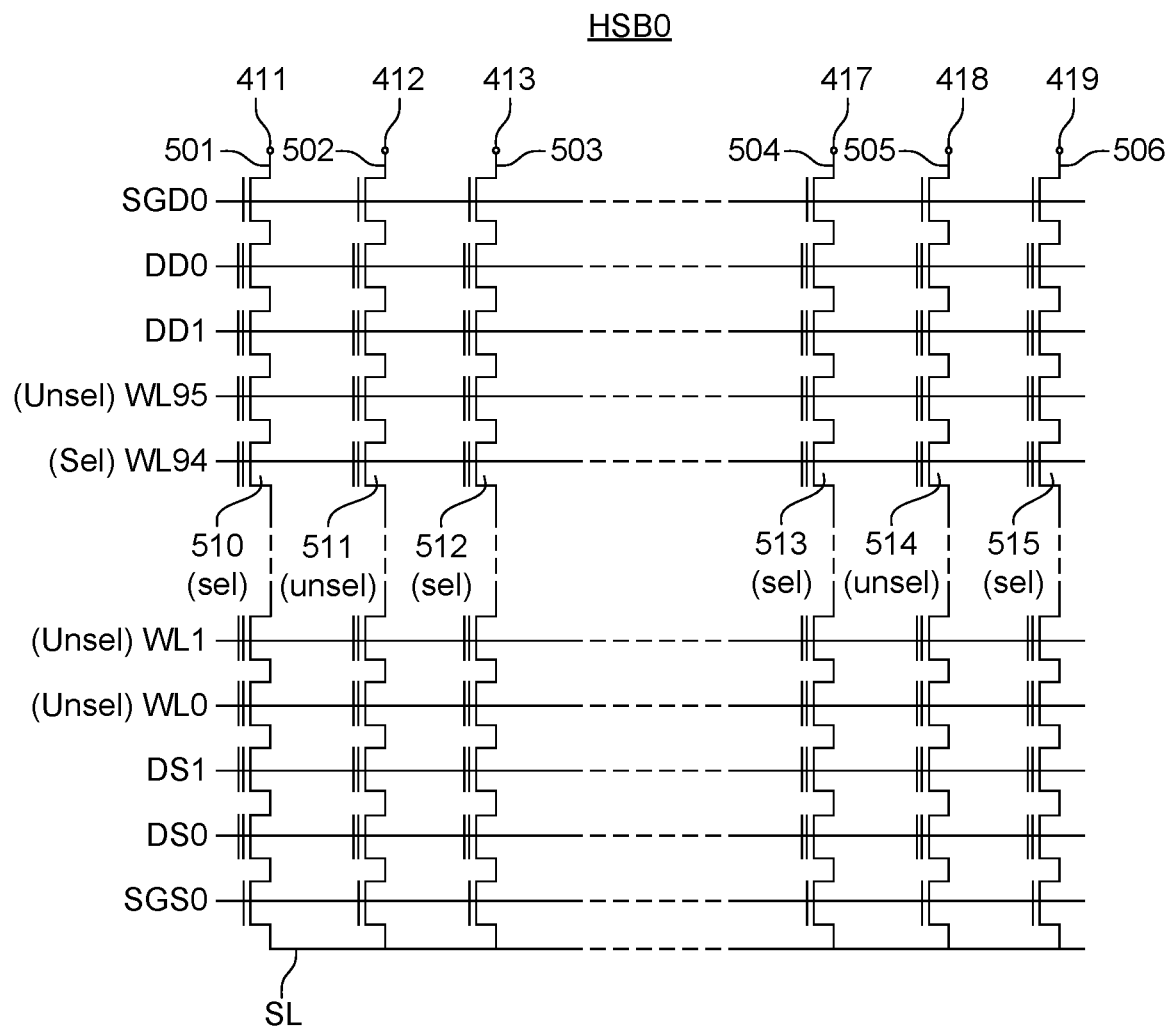
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
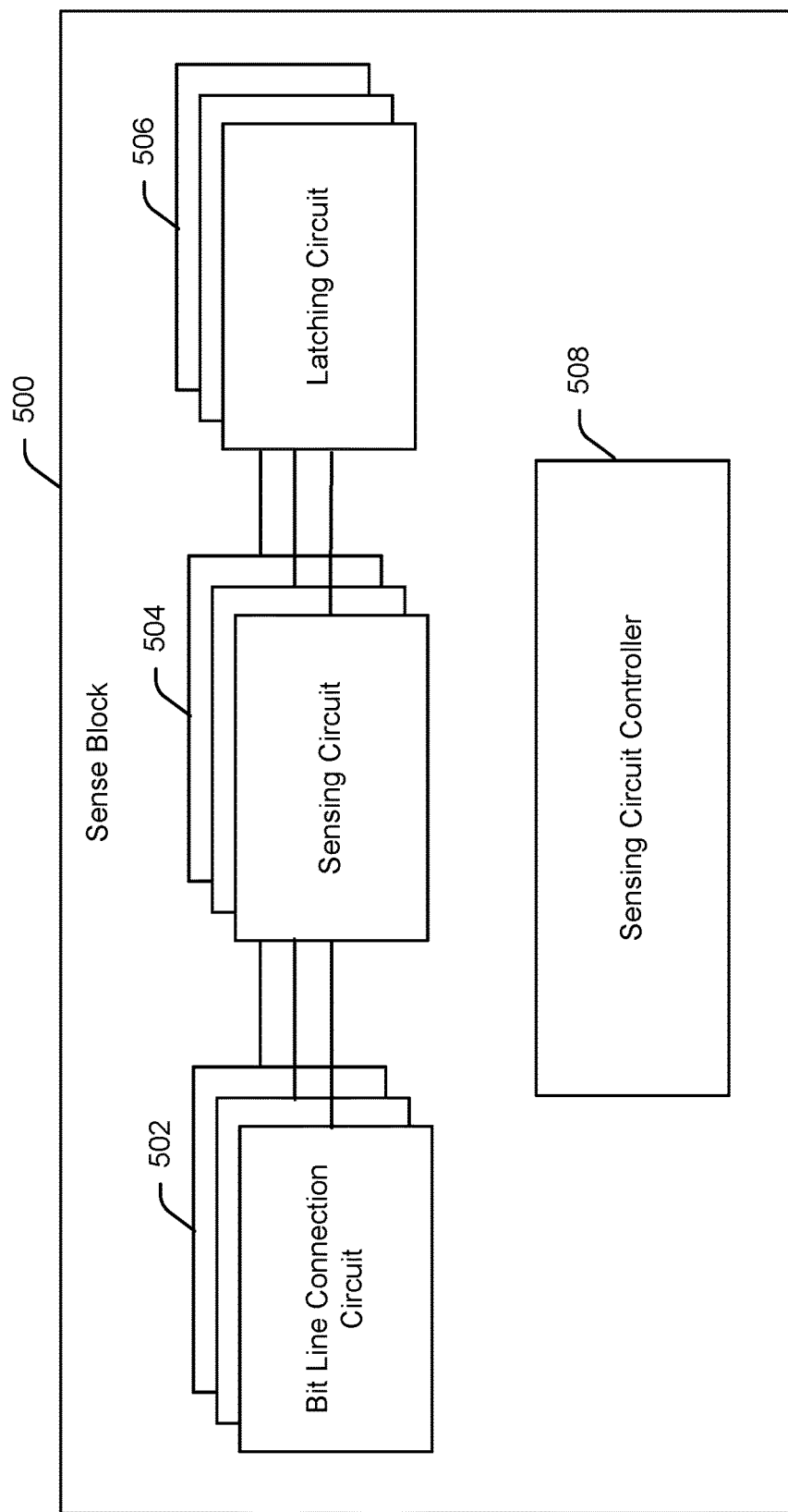
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
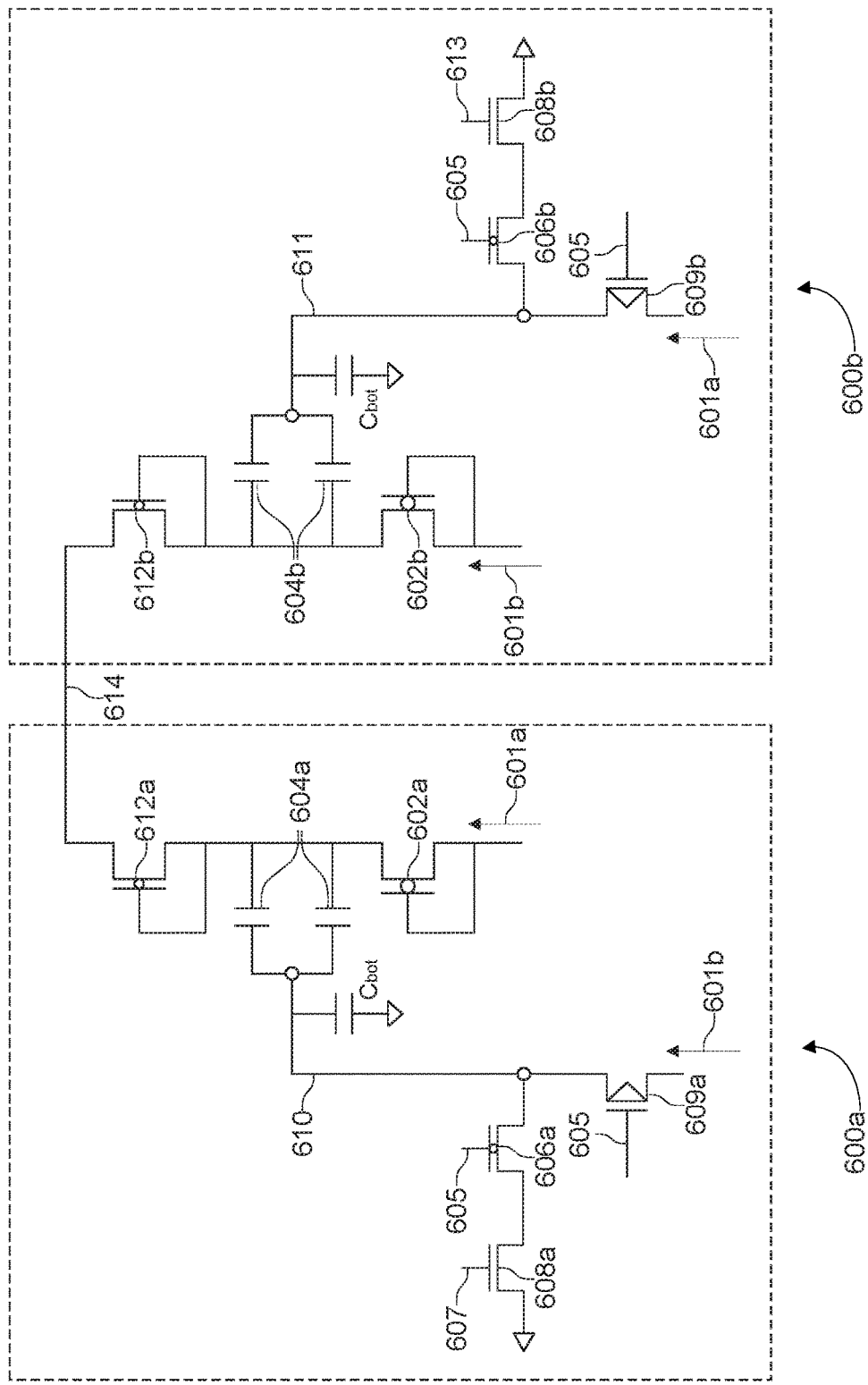
FIG. 6 is a schematic diagram of an example configuration of a high voltage (HV) stage of a charge pump that can be implemented within the power control circuit of FIG. 1 in accordance with example embodiments of the disclosed technology.

FIG. 6 is a schematic diagram of an example configuration of a high voltage (HV) stage of a charge pump, such as a charge pump that may be included in the power control circuitry 116 (FIG. 1). Specifically, FIG. 6 depicts the HV stage in a 6× configuration that operates in two phases: 1) a charge phase and 2) a boost/kick phase. FIG. 6 depicts two charge and kick circuits 600a and 600b (generically referred to herein as charge and kick circuit 600). In some embodiments, charge and kick circuits 600a and 600b may be mirror circuits of each other. The charge and kick circuits 600a and 600b may operate in parallel but on opposite phases of a clock or clocking signal, such that as charge and kick circuit 600a is in the charging phase, charge and kick circuit 600b is in the boosting/kicking phase, or vice versa. As such, the charge pump may be able to charge one of the charge and kick circuits 600 while performing a boosting/kicking operation with the other charge and kick circuit 600 based on the respective clock phase. In general, during the boosting/kicking phase, a resulting output voltage, $V_{out}$, generated by the respective charge and kick circuit 600 that is operating in the boosting/kicking phase is higher than a charging or input voltage, $V_{in}$, that is, in turn, used to charge the other charge and kick circuit 600. The input voltage $V_{in}$ may be provided by one or more low voltage stages of the charge pump (not shown in FIG. 2).

In a first phase, one or more HV capacitors 604a are charged to a voltage $V_{charge}$ using an input voltage $V_{in}$ from an input node 601a via a path through a first connected device 602a (e.g., a first diode-connected transistor), the capacitor(s) 604a, a first switch 606a controlled based on a pump control signal 605, and a second switch 608a controlled based on a charge clock signal 607. As noted, the first connected device 202a may be a diode-connected transistor, where a drain terminal and a gate terminal of the transistor are shorted such that a cut in voltage of the diode corresponds to a threshold voltage of the transistor.

In a second phase, the capacitor(s) 604a boost an input voltage $V_{in}$ from an input node 601b via a path through a switch 609a controlled by the pump control signal 605, the capacitor(s) 604a, a second connected device 612a (e.g., a second diode-connected transistor), and ultimately, to an output node 614. The second connected device 612a, similar to the first connected device 602a, may be a diode-connected transistor, where a drain terminal and a gate terminal of the transistor are shorted. The first and second connected devices 602a, 612a may comprise intrinsic NMOS devices (e.g., intrinsic NMOS transistors).

In example embodiments, the second charge and kick circuit 600b may operate similarly on opposite clock phases as the first charge and kick circuit 600a. Specifically, in the first phase, while the capacitors 604a are being charged as described above, one or more HV capacitors 604b kick the input voltage $V_{in}$ from the input node 601a via a path through a switch 609b controlled by the pump control signal 605, the capacitor(s) 604b, and through a fourth connected device 612b (e.g., a fourth diode-connected transistor) to the output node 614. During the second phase, while the capacitors 604a are boosting or kicking the input voltage as described above, the capacitors 604b are charged to a charge voltage, $V_{charge}$, using the input voltage $V_{in}$ from the input node 601b via a path through a third connected device 602b (e.g., a third diode-connected transistor), the capacitor(s) 604b, a third switch 606b controlled based on the pump control signal 605, and a fourth switch 608b controlled based on a charge clock signal 613, where the charge clock signals 607 and 613 operate on opposite phases.

The first connected device 602a may limit flow from the capacitor(s) 604a back into the low voltage stage of the charge pump during the kick phase of the first charge and kick circuit 600a. For example, while the first connected device 602a is closed when charging the capacitor(s) 604a, the first connected device 602a is open when kicking through the capacitor(s) 604a, thereby inhibiting any backflow through the first connected device 602a into the low voltage stage of the charge pump. Similarly, the third connected device 602b may limit flow from the capacitor(s) 604b back into the low voltage stage of the charge pump during the kick phase of the second charge and kick circuit 600b.

The second/fourth connected device 612a/612b may limit flow between the output node 214 and the remainder of the respective corresponding charge and kick circuit 600a/600b when the other charge and kick circuit is generating the output (boosting or kicking the input voltage $V_{in}$). For example, when the second connected device 612a is closed while the first charge and kick circuit 600a provides the boosted or kicked output to the output node 214, the fourth connected device 612b is open to prevent any backflow from the output node 214 through the fourth connected device 612b into the second charge and kick circuit 600b. Similarly, the second connected device 612a may limit flow from the output 214 back through the first charge and kick circuit 600a while the second charge and kick circuit 600b is generating its boosted or kicked output on the output node 214. Thus, the connected devices 602a/602b and 612a/612b may enable a charge transfer from the LV stage to the HV stage and from the HV stage to the output node 214 such that no back-currents flow through various portions of the charge pump.

While the following description focuses primarily on the first charge and kick circuit 600a, it will be understood that the description similarly applies to the second charge and kick circuit 600b during an alternative phase of the clock signal. During the charge phase of the capacitor(s) 604a of the first charge and kick circuit 600a, a first voltage may be lost across the first connected device 602a. This voltage loss may correspond to or be equivalent to a threshold voltage, Vth, of the first connected device 602a, which may be a diode-connected transistor. This threshold voltage may be a minimum voltage required to enable current flow through the first connected device 602a to charge the capacitor 604a. As a result of this voltage loss across the first diode-connected transistor 602a, the capacitor(s) 604a may only be charged to a difference between the input voltage from the input node 601a and the threshold voltage of the diode-connected transistor 602a (i.e., $V_{charge}=V_{in}-V_{th}$), as opposed to an ideal charge equal to the input voltage $V_{in}$ (assuming an ideal threshold voltage of 0).

Furthermore, during the kick phase of the first charge and kick circuit 600a, a second voltage may be lost across the second connected device 612a. This second voltage loss may correspond to or be equivalent to a threshold voltage, Vth, of the second connected device 612a, which may be a diode-connected transistor similar to the first connected device 602a, as described above. Thus, the output voltage generated at the output node 214 during the kick phase of the first charge and kick circuit 600a may correspond to the difference between twice the input voltage and twice the threshold voltage (i.e., $V_{out}=2V_{in}-2V{th}$, assuming the threshold voltages for the two diode-connected transistors 602a and 612a are substantially the same.

This cumulative output voltage loss (i.e., the voltage loss at each of the first and second connected devices 602a, 612a) can result in a reduction in pump strength (e.g., the output voltage) of the charge pump. To compensate for this reduced pump strength, the charge pump (for example, a size or a number of the HV capacitor(s) 604a) may be increased so that the output voltage—after accounting for the voltage loss across first and second connected devices 602a, 612a—is equal to a desired boosted or kicked output voltage. Thus, based on the relationship between the charge pump size and the load on the charge pump, the above-described voltage loss ultimately leads to lost area on the flash memory die.

Referring again to the example introduced above, where the output voltage is the difference between twice the input voltage and twice the threshold voltage ($V_{out}=2V_{in}-2V_{th}$), the charge pump may be sized such that the storage capabilities of the capacitor(s) 604a are increased to compensate for the voltage loss. This generally involves employing larger circuit components and/or a greater number of circuit components, which in turn, increases the charge pump area on the flash memory die. Since flash memory die area comes at a premium, any increase in the die area required for the charge pump is undesirable.

In charge and kick circuit 600a, the gates of the respective first and second connected devices 602a, 612a are shorted to the drains. Similarly, in charge and kick circuit 600b, the gates of the respective third and fourth connected devices 602b, 612b are shorted to the drains. Thus, the gates of the connected devices 602a, 612a and the gates of the connected devices 602b, 612b are not independently controlled. Instead, only the charge clock signal 607 and 613 are controlled by a clocking, or similar, signal. The charge clock signals 607 and 613 may inversely control a charging of the capacitor(s) 604a and a kicking via the capacitor(s) 604b, respectively, meaning that the charge clock signal 607 may activate the charging of the capacitor(s) 604a in the first charge and kick circuit 600a while the charge clock signal 613 activates the kicking via the capacitor(s) 604b in the second charge and kick circuit 600b. The input node 601a used to charge the capacitor(s) 604a in the first charge and kick circuit 600a is also the input node that provides the boost input voltage to be boosted by the capacitor(s) 604b in the second charge and kick circuit 600b. Similarly, the charge clock signal 613 may activate the charging of the capacitor(s) 604b in the second charge and kick circuit 600b while the charge clock signal 607 activates the kicking via the capacitor(s) 604a in the first charge and kick circuit 600a. The input node 601b used to charge the capacitor(s) 604b in the second charge and kick circuit 600b is also the input node that provides the boost input voltage that is boosted by the capacitor(s) 604a in the first charge and kick circuit 600a. The charge clock signals 607 and 613 may themselves be inversely controlled such that only one of these clock signals is high at any given time.

Figure 7:
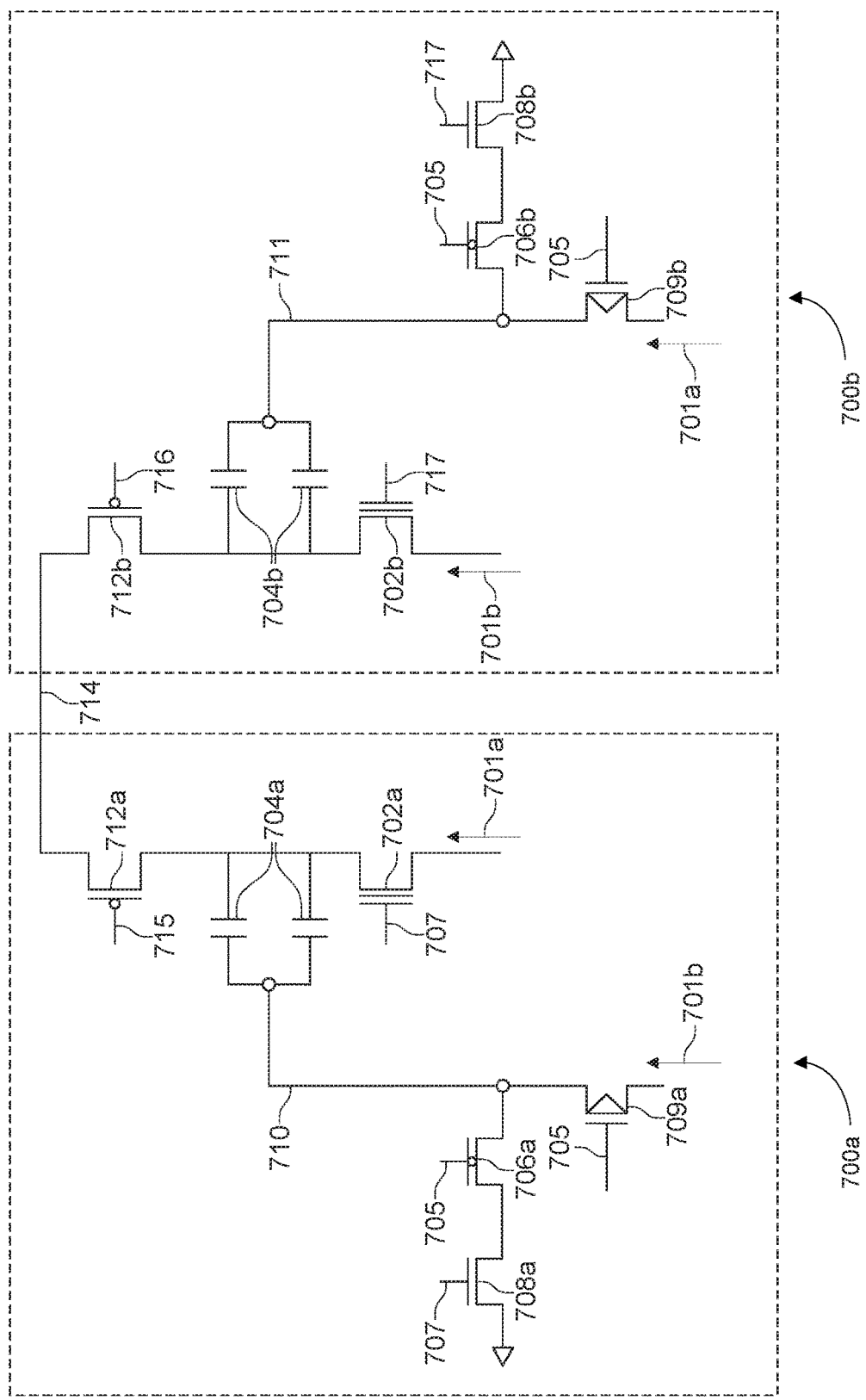
FIG. 7 is a schematic diagram of an example configuration of an HV stage of a hybrid charge pump that can replace the HV stage of the charge pump described above with reference to FIG. 6 in accordance with example embodiments of the disclosed technology.

FIG. 7 is a schematic diagram of an example configuration of an HV stage of a hybrid charge pump that can replace the HV stage of the charge pump described above with reference to FIG. 6. The HV stage of FIG. 7 employs a different arrangement of components as compared to the HV stage of FIG. 6 described above, in order to reduce or eliminate the voltage drop that occurs across the first/third and second/fourth connected devices 602a/602b and 612a/612b in the HV stage of FIG. 6. By reducing or eliminating this voltage drop, the HV stage of FIG. 7 exhibits improved output voltages, and as a result, more efficient usage of the die area for the charge pump compared to the HV stage of FIG. 6. More specifically, because the HV stage of FIG. 7 reduces the voltage losses across the first/third and second/fourth connected devices 602a/602b and 612a/612b of the HV stage of circuits 600a/600b, the physical size of the charge pump on the flash memory die can be made smaller than what is achievable for a charge pump with the HV stage depicted in FIG. 6 for a given output voltage.

In the HV stage of the charge and kick circuits 700a and 700b depicted in FIG. 7, HV capacitor(s) 704a and HV capacitor(s) 704b may be charged via a similar path as HV capacitors 604a, 604b of FIG. 6. Referring first to the circuit 700a, in a first phase of the HV stage, the capacitor(s) 704a are charged using an input voltage $V_{in}$ from an input node 701a via a path through a first connected device 702a, the capacitor(s) 704a, a first switch 706a controlled based on a pump control signal 705, and a second switch 708a controlled based on a charge clock signal 707. In a second phase of the HV stage, the capacitor(s) 704a kick an input voltage $V_{in}$ from input node 701b via a path through a switch 709a controlled by the pump control signal 705, the capacitor(s) 704a, and a second connected device 712a. The second charge and kick circuit 700b may operate similarly on opposite clock phases as the first charge and kick circuit 700a. Specifically, in the first phase, while the capacitors 704a are being charged as described above, the HV capacitor(s) 704b kick the input voltage $V_{in}$ from the input node 701a via a path through a switch 709b controlled by the pump control signal 705, the capacitor(s) 704b, and a fourth connected device 712b (e.g., a fourth diode-connected transistor) to the output node 714. In addition, during the second phase, while the capacitor(s) 704a are boosting or kicking the input voltage as described above, the capacitor(s) 704b are charged to a charge voltage, $V_{charge}$, using the input voltage $V_{in}$ from the input node 701b via a path through a third connected device 702b (e.g., a third diode-connected transistor), the capacitor(s) 704b, a third switch 706b controlled based on the pump control signal 705, and a fourth switch 708b controlled based on a charge clock signal 713, where the charge clock signals 707 and 713 operate on opposite phases.

However, in contrast to the HV stage of the charge pump circuits 600a, 600b depicted in FIG. 6, in which the first/third and second/fourth connected devices 602a/602b, 612a/612b comprise intrinsic NMOS devices, the first/third and second/fourth connected devices 702a/702b, 712a/712b comprise a hybrid combination of devices. More specifically, in example embodiments, the first connected device 702a comprises a depletion-mode NMOS device and the second connected device 712a comprises an enhancement-mode PMOS device. Similarly, in example embodiments, the third connected device 702b comprises a depletion-model NMOS device and the fourth connected device 712b comprises an enhancement-mode PMOS device. This results in a hybrid charge pump arrangement with two different types of connected devices.

Referring to the circuit 700a for explanatory purposes, in those embodiments in which the first connected device 702a is a depletion-mode NMOS device, it has a negative threshold voltage, $V_{th}$, which means that the device 702a will allow current to pass through as long as a non-negative voltage is applied to the gate of the device 702a. As a result, the first connected device 702a enables current to pass through at a reduced voltage loss as compared to the first connected device 604a. For example, during the charging phase of the first charge and kick circuit 700a, a gate voltage of the first connected device 702a can be set equal to the input voltage, such that all the voltage from the input is transferred to the capacitor(s) 704a. Because the first connected device 702a is a depletion-mode NMOS device with a negative threshold voltage, a zero gate-source voltage (obtained by setting the gate voltage equal to the input voltage) is sufficient to turn the transistor on and cause all or substantially all charge from the input node 701a to be transferred to the capacitor(s) 704(a) through the first connected device 702a. Thus, the threshold voltage of the first connected device 702a does not cause a voltage drop across the first connected device 702a as it does with the first connected device 602a of the HV stage of the charge pump depicted in FIG. 6.

Further, during the kick phase of the first charge and kick circuit 700a, the second connected device 712a, which in example embodiments, is an enhancement-mode PMOS device, can be activated by applying a gate voltage (e.g., 0V) lower than the source voltage ($V_{charge}$), which results in the second connected device 712a passing the input voltage with minimal or no voltage drop. Thus, due to the second connected device 712a being an enhancement-mode PMOS device with a threshold voltage such that it is not activated at a zero gate-source voltage, there is no (or at least a reduced) voltage drop across the second connected device 712a as compared to the second connected device 612a of the HV stage of the charge pump depicted in FIG. 6. In short, utilizing a depletion-mode NMOS device for the first connected device 702a and an enhancement-mode PMOS device for the second connected device 712a eliminates or at least significantly reduces the voltage drop through the first and second connected devices 702a, 712a as compared to what is experienced by the first and second connected devices 602a, 612a. Along similar lines, the voltage drop across the third and fourth connected devices 702b, 712b is eliminated or otherwise significantly reduced as compared to what is experienced by the third and fourth connected devices 702b, 712b.

In some embodiments, a clocking scheme controls features of the HV stage of FIG. 7. Assuming that the charge and kick circuit 700a is generating an output at the output node 714, the clocking signal may trigger opening of the second connected device 712a by changing the gate node of the second connected device 712a from a low value (for example, 0V) to a high value (for example, 6 times the boost input voltage). As noted above, turning off (i.e., opening) the second connected device 712a ensures that no current from the output node 714 flows back through the first charge and kick circuit 700a. The clocking signal may then turn off the boost input voltage 710 (e.g., change the boost input voltage 710 from 3 times the input voltage to 0V). As such, it is ensured that no current is taken from the output node 714 because the second connected device 712a is already off when the boost input voltage 710 is turned off. Referring now to the circuit 700b, the boost voltage 711 is first turned on (e.g., the boost input voltage 711 goes from 0 to 3 times the input voltage), and then the second connected device 712b is turned on (e.g., the gate voltage for the second connected device 712b goes from a high voltage, such as 6 times the boost input voltage 711, to a low voltage, such as 0V). This ensures that the boosted voltage is greater than the output voltage before the second connected device 712b is turned on or closed.

In some embodiments, the clocking scheme of the HV stage of the charge pump of FIG. 7 involves disabling one of the charge and kick circuits 700a, 700b from providing an output to the output node 714 before enabling the other of the charge and kick circuits 700a, 700b to provide the output to the output node 714. Specifically, logic in a controller, clock, or similar device may generate a clock or similar signal that causes deactivation of the boost or kick from the active (or kicking) charge and kick phase before activating the boost or kick from the inactive (or charging) charge and kick phase. For example, when the second charge and kick circuit 700b is actively boosting or kicking to generate a boosted or kicked output at the output node 714, the clocking scheme may first deactivate the second charge and kick circuit 700b before activating the first charge and kick circuit 700a to generate its boosted or kicked output at the output node 714. For example, when the second charge and kick circuit 700b is supplying the voltage to the output node 714, the clock signal will cause the fourth connected device 712b to open (thereby deactivating the kick of the second charge and kick phase 700b) by, for example, changing a gate voltage 716 applied to the active fourth connected device 712b from a low voltage value (e.g., 0V) to a higher voltage value. Subsequently, the clock signal may control a change of a boost input signal 711 from the input node 701a from a high value (for example, the input value to be boosted or kicked by the capacitor(s) 704b) to a low value (for example, 0V). Following the deactivation of the boost input signal 711, the clock signal may control a change of a boost input signal 710 from a low value (for example, 0V) to a high value (for example, the input value to be boosted or kicked by the capacitor(s) 704a). Based on the clock signal, the boost input signal 710 and the boost input signal 711 may alternatively provide an input to be boosted by the corresponding capacitor(s) 704a and 704b, respectively. After the boost input signal 710 is provided to the capacitor(s) 704a, the clock signal may close the second connected device 712a (thereby activating the kick of the second charge and kick circuit 700a) by, for example, changing a gate voltage 715 applied to the inactive second connected device 712a from a higher voltage value to a lower voltage value (e.g., 0V). Thus, the first charge and kick circuit 700a is enabled to generate the boosted or kicked voltage output at the output node 714 when the second charge and kick circuit 700b is disabled from doing so, thereby preventing current back flow between the charge and kick circuits 700a, 700b of the HV stage. Thus, as compared to the clocking signal referenced with respect to the HV stage in FIG. 6, the clocking signal of the HV stage in FIG. 7 includes additional controls over the gates of the second and fourth connected circuits 712a and 712b, respectively.

In some embodiments, referring to the HV stage of FIG. 6, the node 601a charges the capacitor(s) 604a in the charge phase to the difference between 3 times the input voltage (e.g., the input voltage PMPSUP) and the threshold voltage of the first connected device 602a. In the kick phase, the boost input voltage 610, which may correspond to the voltage at the node 601b, kicks the capacitor(s) 604a so that a voltage on a top-plate of the capacitors 604a increases to a difference between 6 times the boost input voltage 610 and the sum of the threshold voltages of the first connected device 602a and the second connected device 612a. During this kick phase, the node 601b may be PMPSUP.

On the other hand, in the hybrid charge pump of FIG. 7, the HV stage may experience reduced voltage loss due to the reduction or elimination of the voltage loss due to the threshold voltages of the first/third and second/fourth connected devices 702a/702b and 712a/712b. For example, the node 701a may charge the capacitor(s) 704a in the charge phase to 3 times the input voltage (e.g., the input voltage PMPSUP). In the kick phase, the boost input voltage 710, which may correspond to the voltage at the node 701b, kicks the capacitor(s) 704a so that a voltage on a top-plate of the capacitors 704a may increase to 6 times the boost input voltage 710. During this kick phase, the node 701b may be PMPSUP.

Figure 8:
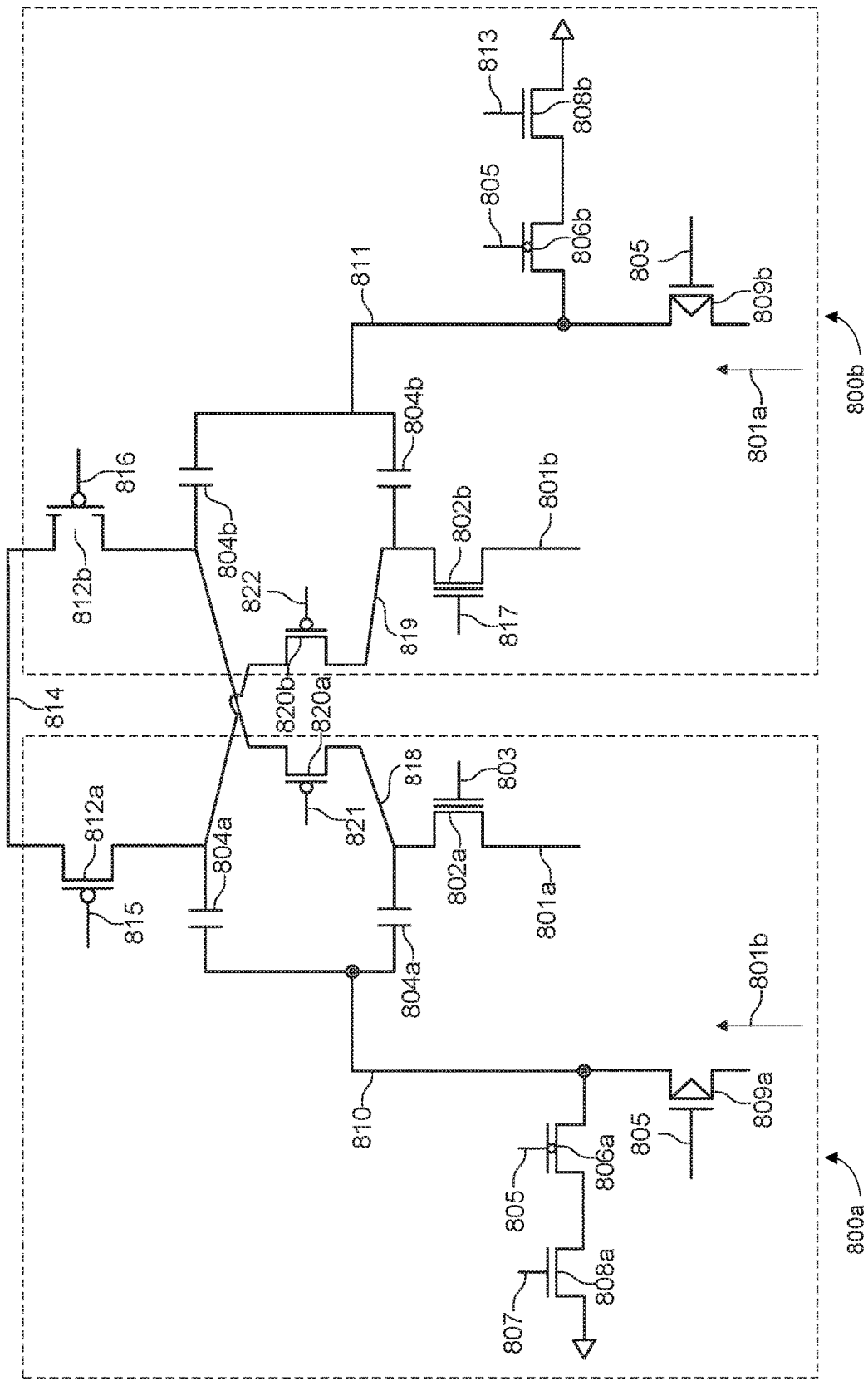
FIG. 8 is a schematic diagram of an example configuration of another HV stage of a hybrid charge pump that can replace the HV stage of the charge pump described above with reference to FIG. 6 in accordance with example embodiments of the disclosed technology.

FIG. 8 is a schematic diagram of an example configuration of another HV stage of a hybrid charge pump that can replace the HV stage of the charge pump described above with reference to FIG. 6. Specifically, the HV stage depicted in FIG. 7 may correspond to a 6× configuration, while the HV stage depicted in FIG. 8 may correspond to a 9× configuration. In the 9× configuration, the capacitors 804a and the capacitors 804b are connected in series via connected devices 820a and 820b. The 6× configuration may generate an output that is six times (6×) the input voltage, while the 9× configuration may generate an output that is nine times (9×) the input voltage. For example, the 6× configuration of the HV stage shown in FIG. 7 enables each charge and kick circuit 700a, 700b to generate an output of 6*PMPSUP, where PMPSUP is the input voltage from the input nodes 701a, 701b, while the 9× configuration of the HV stage shown in FIG. 8 enables each charge and kick circuit 800a, 800b to generate an output of 9*PMPSUP, where PMPSUP is the input voltage from the input nodes 801a, 801b. The operation of the other components of 9× configuration shown in FIG. 8 may be similar to that of the 6× configuration shown in FIG. 7, with similarly numbered components providing similar operation and/or functionality.

Figure 9:
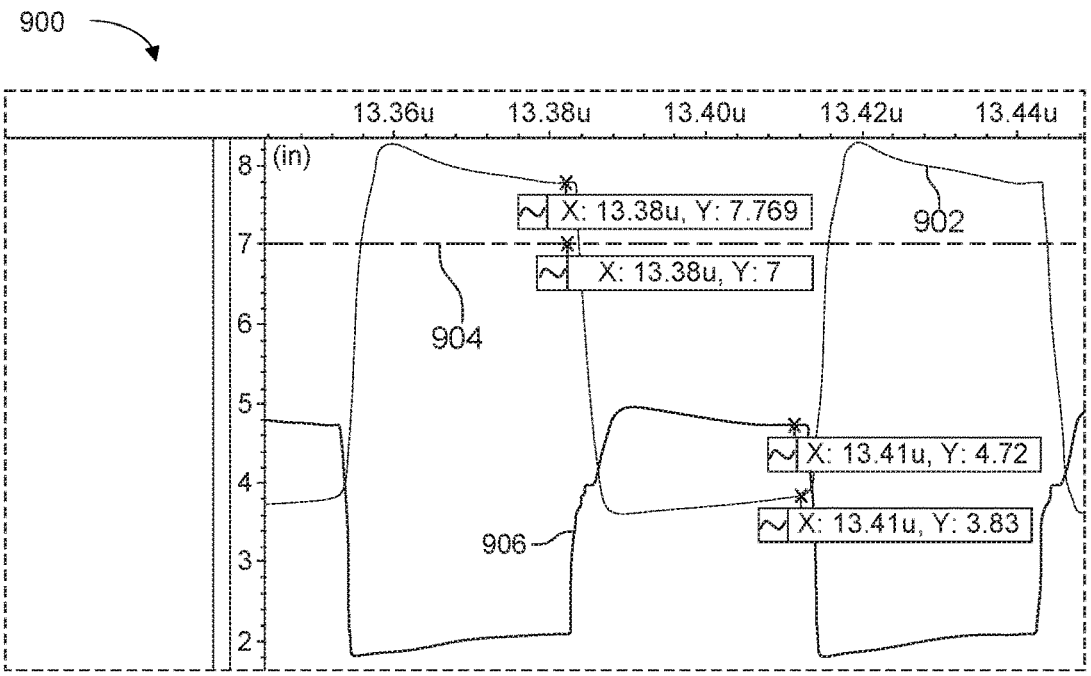
FIG. 9 illustrates a graph of multiple waveforms indicating voltage drops introduced by one or more components of the HV stage of the charge pump of FIG. 6 in accordance with example embodiments of the disclosed technology.

FIG. 9 illustrates a graph 900 of multiple waveforms 902-906 indicating voltage drops introduced by one or more components of the HV stage of the charge pump of FIG. 6. The graph 900 depicts time along an x-axis and voltage along a y-axis and shows three phases of operation of, for example, the charge and kick circuit 600a. While circuit 600a is referenced below, it should be appreciated that the discussion is equally applicable to circuit 600b. The three phases may include two kick phases and one charge phase. The graph 900 further includes a boosted voltage line 902, representing a voltage available at an input of the second connected device 612a, a target voltage line 904, representing a target voltage to be output at the output node 614 after the second connected device 712a is closed, and an input voltage line 906 representing the input voltage used to charge the capacitor(s) 604a (for example, the voltage from the input node 601a).

The graph 900 illustrates how, during the kick phases, the boosted voltage line 902, representing the voltage that passes through the second connected device 612a, approaches the target voltage line 904. Specifically, the voltage that passes through the second connected device 612a approaches the 7V value of the target voltage line 904 (a voltage of 7.769V is shown for the boosted voltage line 902 at a point approaching the target voltage line 904). The graph 900 further illustrates how, during the charge phase, the boosted voltage line 902 approaches the input voltage line 906 used to charge the capacitor(s) 604a. Specifically, the voltage of the charged capacitor(s) 604a approaches the value of the input voltage 601a used to charge the capacitor(s) 604a (a voltage of 4.72V is shown for the input voltage line 906 at a point approaching a voltage of 3.83V of the boosted voltage line 902). The difference between the boosted voltage line 902 and the target voltage line 904 during the kick phases (e.g., 7.769V-7V) represents the voltage loss that occurs at the second connected device 612a due, for example, to the threshold voltage of the second connected device 612a. Similarly, the difference between the boosted voltage line 902 and the input voltage line 906 during the charge phase (e.g., 4.72V-3.83V) represents the voltage loss that occurs at the first connected device 602a due, for example, to the threshold voltage of the first connected device 602a.

Figure 10:
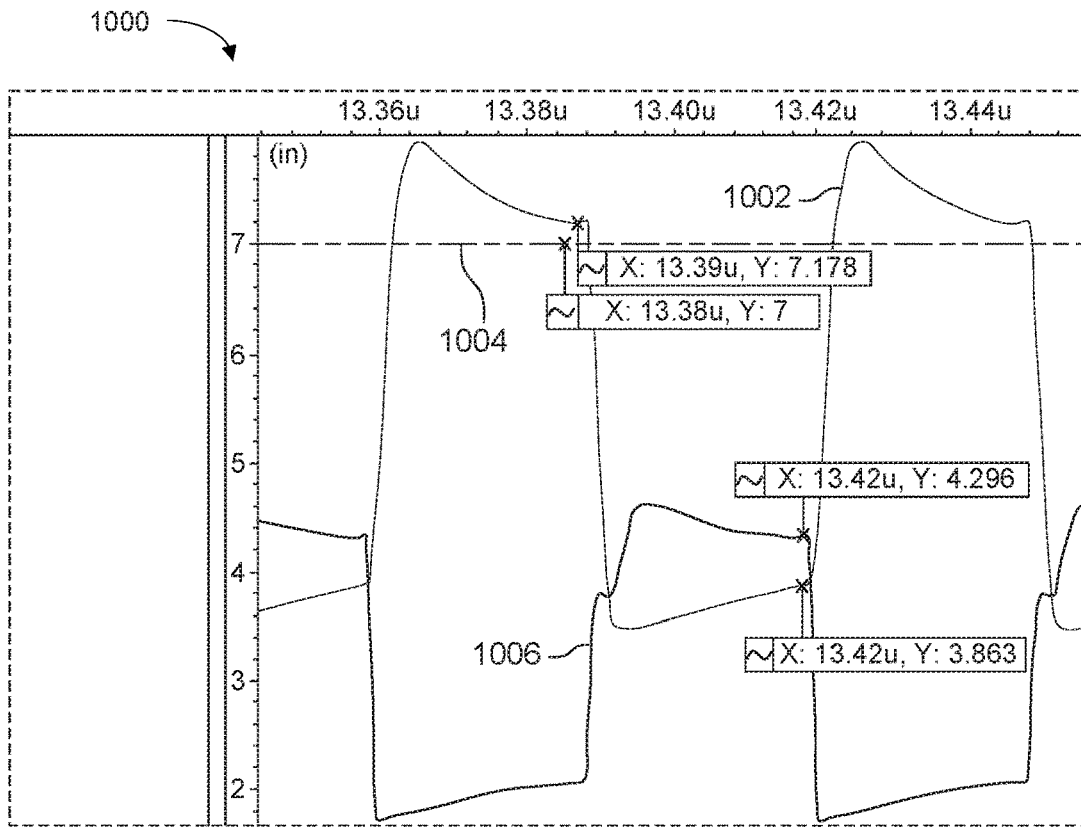
FIG. 10 illustrates a graph of multiple waveforms indicating reduced voltage drops introduced by one or more components of the HV stage of the hybrid charge pump of FIG. 7 in accordance with example embodiments of the disclosed technology.

FIG. 10 illustrates a graph 1000 of multiple waveforms 1002-1006 that illustrate the reduced voltage drops associated with the HV stage of the hybrid charge pump of FIG. 7. The graph 1000 depicts time along an x-axis and voltage along a y-axis and shows three phases of operation of the HV stage of the hybrid charge pump of FIG. 7: two kick phases and one charge phase. While FIG. 10 is described below with reference to the charge and kick circuit 700a, it should be appreciated that the discussion is equally applicable to the circuit 700b. The graph 1000 further includes a boosted voltage line 1002, representing a voltage available at the input of the second connected device 712a, a target voltage line 1004, representing a target voltage to be output at the output node 714 after the second connected device 712a is closed, and an input voltage line 1006 representing the voltage used to charge the capacitor(s) 704a (for example, the voltage at the input node 701a).

The graph 1000 illustrates how, during the kick phases, the boosted voltage line 1002, representing the voltage that passes through the second connected device 712a, approaches the target voltage line 1004. Specifically, the voltage that passes through the second connected device 712a approaches the 7V value of the target voltage line 1004 (a voltage of 7.178V is shown for the boosted voltage line 1002 at a point approaching the target voltage line 1004). The graph 1000 further illustrates how, during the charge phase, the boosted voltage line 1002 approaches the input voltage line 1006 used to charge the capacitor(s) 704a. Specifically, the voltage of the charged capacitor(s) 704a approaches the value of the input voltage 701a used to charge the capacitor(s) 704a (a voltage of 4.296V is shown for the input voltage line 1006 at a point approaching a voltage of 3.863V of the boosted voltage line 1002).

A comparison of the voltage difference between the boosted voltage line 1002 and the target voltage line 1004 during the kick phase and the voltage difference between the input voltage line 1006 and the boosted voltage line 1002 during the charge phase to the corresponding voltage difference between the boosted voltage line 902 and the target voltage line 904 during the kick phase and the voltage difference between the input voltage line 906 and the boosted voltage line 902 during the charge phase illustrates how the hybrid charge pump provides an improved (i.e., reduced) voltage loss through the corresponding first/third and second/fourth connected devices 702a/702b and 712a/712b of the HV stage of the charge pump of FIG. 7 as compared to the voltage loss through the first/third and second/fourth connected devices 602a/602b and 612a/612b of the HV stage of the charge pump of FIG. 6. This reduction in the voltage losses results in an area savings of 16% of the flash memory die and a current increase of 20% across a corresponding voltage range of the hybrid charge pump of FIG. 7 as compared to the charge pump of FIG. 6.

Figure 11:
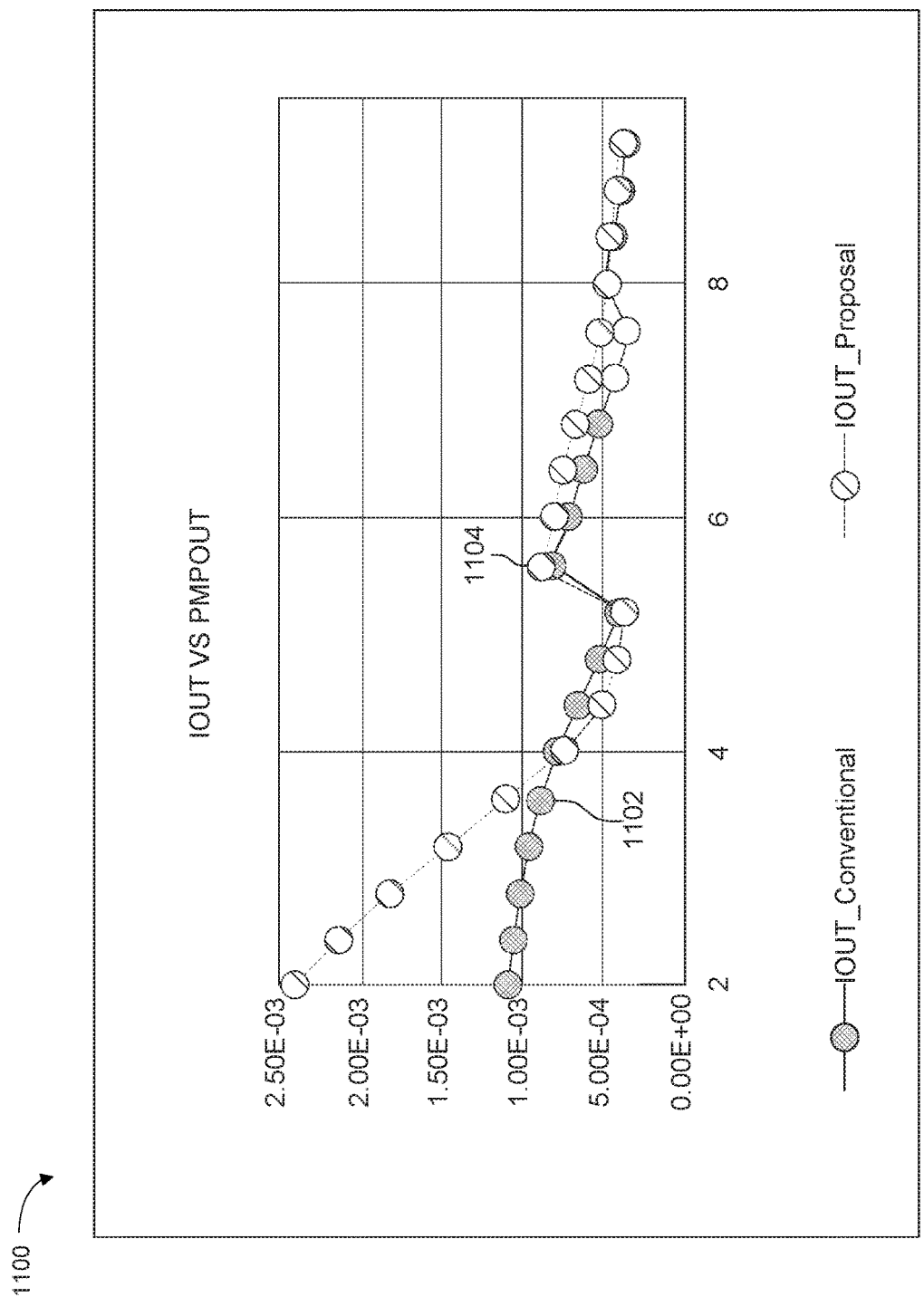
FIG. 11 illustrates a graph comparing output currents generated by a charge pump having a HV stage as depicted in FIG. 6 and a hybrid charge pump having the HV stage as depicted in FIG. 7 in accordance with example embodiments of the disclosed technology.

FIG. 11 illustrates a graph 1100 comparing output currents generated by a charge pump having the HV stage as depicted in FIG. 6 and a hybrid charge pump having the HV stage as depicted in FIG. 7. The graph 1100 depicts time along an x-axis and current along a y-axis and shows three phases of operation of the HV stage of the hybrid charge pump of FIG. 7: two kick phases and one charge phase.

Figure 12:
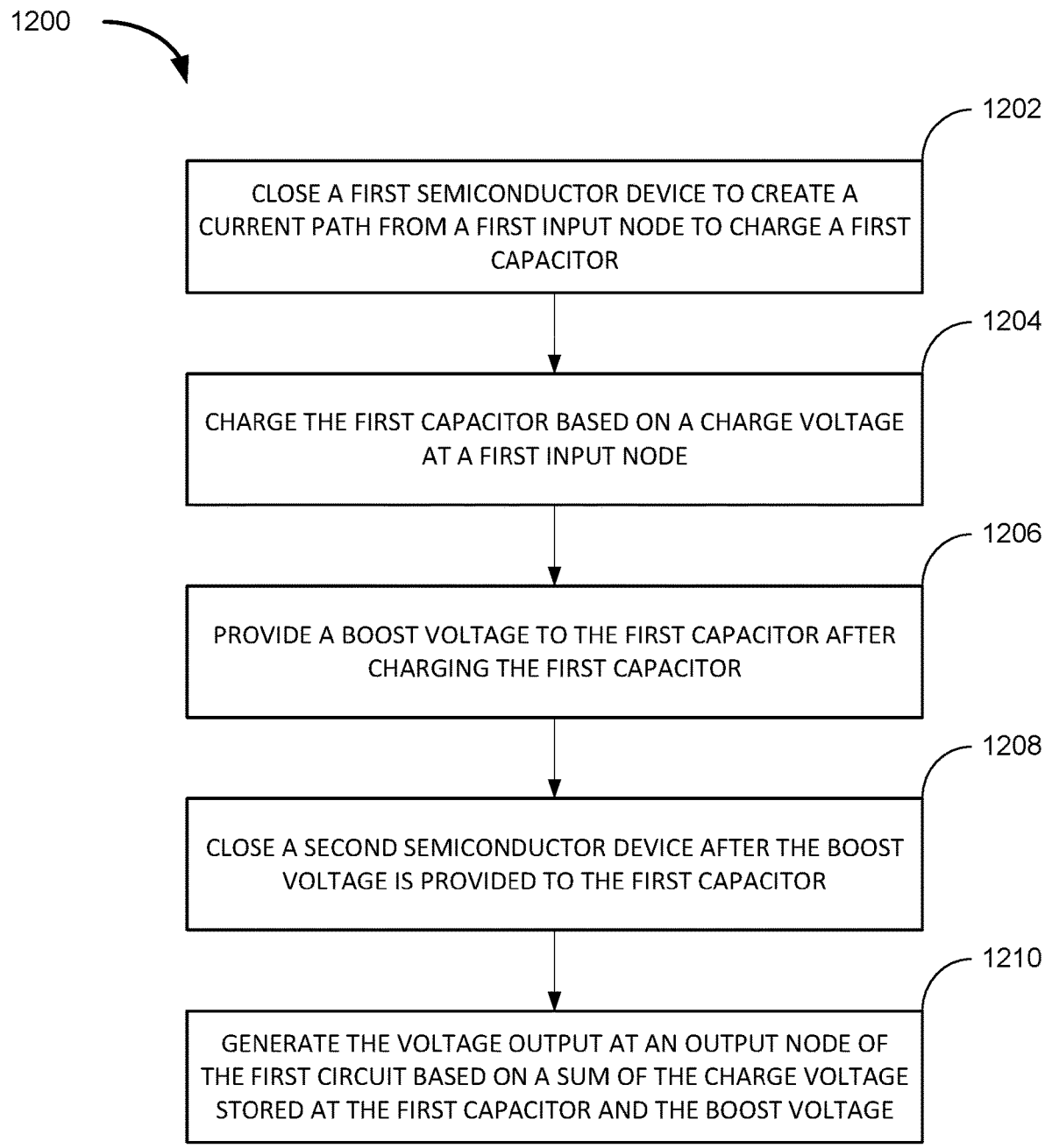
FIG. 12 is a flowchart illustrating an example method that can be performed to implement various features of example embodiments of the disclosed technology.

FIG. 12 shows example steps that can be performed by the controller 122 (FIG. 1) or an external controller to control a charge pump having the hybrid HV stage as shown in FIG. 7 to perform a method 1200. For example, the controller 122 can fetch, decode, and/or execute one or more instructions for performing various steps of the method 1200. Various instructions (e.g., for performing one or more steps described herein) can be stored in non-transitory storage medium of controller 122 and/or control logic circuitry 110, where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of controller 122 may be encoded with executable instructions, for example, instructions for executing steps of the method 1200. Non-transitory media is distinct from but may be used in conjunction with transmission media. Transmission media participates in transferring information between non-transitory media. For example, transmission media includes coaxial cables, copper wire and fiber optics, including the wires that comprise bus between the controller 102 and a host. Transmission media can also take the form of acoustic or light waves, such as those generated during radio-wave and infra-red data communications.

The method 1200 may comprise a method of outputting a voltage from a circuit, such as a hybrid charge pump circuit. The hybrid charge pump circuit, as described above, may comprise an HV stage that employs a combination of depletion-mode NMOS devices and enhancement-mode PMOS devices to operate in charge and kick phases to generate and output boosted voltages from the hybrid charge pump. Operations that make up the method 1200 can include a step 1202 at which a first semiconductor device is closed to create a current path from a first input node to a first capacitor in order to charge the first capacitor. In example embodiments, the first semiconductor device may be to the first connected device (e.g., depletion-mode NMOS device) 702a or the third connected device 702b and the first capacitor may be capacitor(s) 704a or capacitors 704b. Closing the first connected device 704a, for example, creates, as illustrated in FIG. 7, a current path for charging the capacitor(s) 704a, the current path extending from the node 701a—at which a charge voltage is provided—through the first connected device 702a and to ground through the switches 706a and 708a (which are activated by respective gate/control signals, as described above).

At step 1204 of the method 1200, the first capacitor is charged based on a charge voltage at the first input node. For example, the capacitor(s) 704a, as described above, are charged via the current path created by closing the first connected device 702a. The charge voltage may correspond to the input voltage $V_{in}$ available at the input node 701a and received from one or more LV stages of the hybrid charge pump.

At step 1206 of the method 1200, a boost voltage is provided to the first capacitor after charging the first capacitor. As shown with reference to FIG. 7, the boost voltage provided to the capacitor(s) 704a may be the boost voltage 710 received from the input node 701b.

At step 1208 of the method 1200, a second semiconductor device is closed after the boost voltage is provided to the first capacitor. The second semiconductor device may be, for instance, the second connected device 712a through which the capacitor(s) 704a are coupled to the output node 714. By closing the second connected device 712a, current is allowed to flow from the capacitor(s) 304a to the output node 714.

At step 1210 of the method 1200, the voltage output is generated at the output node of the first circuit based on a sum of the charge voltage stored at the first capacitor and the boost voltage. Thus, by closing the second connected device 712a, for example, the charge stored on the capacitor(s) 704a is used to supplement the boost input voltage 710 to generate boosted voltage that is then outputted to the output node 714 through the second connected device 712a.

In some embodiments, the method 1200 can be performed by each of the circuits 700a, 700b of the two-phase hybrid charge pump simultaneously on corresponding (i.e., alternating) phases. For example, as the first charge and kick circuit 700a is charged, the second charge and kick circuit 700b can be kicked, and vice versa. Thus, steps 1202 and 1204 can be performed by one of the first charge and kick circuit 700a or the second charge and kick circuit 700b, while the other of the charge and kick circuit performs the steps 1206, 1208, and 1210.

In some embodiments, the method 1200 is performed to generate the output voltage that is then conveyed to one or more components of the die 108 (FIG. 1), such as a bias voltage generator or other charge pump. In some embodiments, the bias voltage generator may generate bias voltages used to perform one or more operations of one or more other components of the die 104. Furthermore, the output voltage generated by the method 1200 can be provided to any other component(s) of the memory system 100 as needed. In some embodiments, the method 1200 can include additional steps (not shown) or one or more of the illustrated steps may not be performed. In some embodiments, the bias voltage generator or other charge pump may generate a voltage between 2 volts and 10 volts or greater than 10 volts.

A hybrid charge pump according to embodiments of the disclosed the technology has been described above in relation to flash memory devices. However, it should be understood that the disclosed hybrid charge pump, and specifically the HV stage of the hybrid charge pump including the depletion-mode NMOS and enhancement-mode PMOS devices can be employed in place of, or in addition to, non-hybrid charge pumps in any circuit in which non-hybrid charge pumps are used. Such replacement of non-hybrid charge pumps with the hybrid charge pump described herein may provide similar benefits, such as reduced die area dedicated to the charge pump components and improved output voltage and current levels relative to the charge pump size.

In some embodiments, charge pumps may comprise cross-coupled HV stages, where other NMOS or PMOS devices, other than those arrangements described with reference to FIG. 6, are employed. However, such combinations of NMOS and/or PMOS devices do not comprise the depletion-mode NMOS and enhancement-mode PMOS device arrangement described with reference to FIGS. 7 and 8, and thus, the benefits achieved by the hybrid charge pump according to embodiments of the disclosed technology would not be realized (e.g., (reduced or eliminated voltage loss across the first/third and second/fourth connected devices 702a/702b and 712a/712b). Thus, the depletion-mode NMOS and enhancement-mode PMOS device HV stage arrangements disclosed herein also provide improved voltage generation characteristics, and thus reduced die area usage, as compared to cross-coupled HV stages other than the HV stage arrangement described with reference to FIG. 6.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system XYZ00.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method, comprising:
    performing a first charge phase of a first multi-phase circuit of a hybrid charge pump, the first multi-phase circuit comprising a first semiconductor device, a second semiconductor device, a first input node, and a first capacitor, the first charge phase comprising:
        closing the first semiconductor device by applying a non-negative voltage to a gate of the first semiconductor device, to create a first current path from the first input node to the first capacitor, the first semiconductor device comprising a depletion-mode n-channel device having a negative threshold voltage thereby allowing current to pass through when the non-negative voltage is applied to the gate of the depletion-mode n-channel device; and
        charging the first capacitor based on a first input voltage at the first input node; and
    performing a first boost phase of the first multi-phase circuit, the first boot phase comprising:
        providing a first boost voltage to the charged first capacitor;
        closing the second semiconductor device by applying a gate voltage lower than a source voltage of the second semiconductor device, after the first boost voltage is provided to the charged first capacitor, the second semiconductor device comprising an enhancement-mode p-channel device; and
    generating a first voltage output at an output node of the hybrid charge pump based on a first charge voltage stored at the first capacitor and the first boost voltage.

2. The method of claim 1, further comprising:
    performing a second charge phase of a second multi-phase circuit of the hybrid charge pump, the second multi-phase circuit comprising a third semiconductor device, a fourth semiconductor device, a second input node, and a second capacitor, the second charge phase comprising:
        closing the third semiconductor device to create a second current path from the second input node to the second capacitor, the third semiconductor device comprising a depletion-mode n-channel device; and
        charging the second capacitor based on a second input voltage at the second input node; and
    performing a second boost phase of the second multi-phase circuit, the second boost phase comprising:
        providing a second boost voltage to the charged second capacitor;
        closing the fourth semiconductor device after the second boost voltage is provided to the second capacitor, the fourth semiconductor device comprising an enhancement-mode p-channel device; and
        generating a second voltage output at the output node based on a sum of the second charge voltage stored at the second capacitor and the second boost voltage.

3. The method of claim 2, wherein the output node couples the fourth semiconductor device of the second multi-phase circuit to the second semiconductor device of the first multi-phase circuit.

4. The method of claim 2, wherein the first charge phase and the second boost phase are performed during a first phase of a clock signal, and the second charge phase and the first boost phase are performed during a second phase of the clock signal.

5. The method of claim 4, further comprising:
    opening, in response to a transition from the first phase of the clock signal to the second phase of the clock signal, the fourth semiconductor device to prevent a back current from flowing from the output node.

6. The method of claim 5, wherein the first capacitor is charged via the closing of the first semiconductor device after the fourth semiconductor device is opened.

7. The method of claim 2, further comprising providing the first voltage output and the second voltage output during alternating phases of a clock signal to a bias voltage generator coupled to the output node.

8. The method of claim 2, further comprising deactivating the first boost phase prior to initiating the second boost phase.

9. The method of claim 8, wherein deactivating the first boost phase prior to initiating the second boost phase comprises:
    opening the second semiconductor device by increasing a gate voltage applied to the second semiconductor device; and
    deactivating the first boost voltage prior to applying the second boost voltage to the charged second capacitor.

10. The method of claim 1, further comprising shorting a gate of the first semiconductor device to a voltage source of the first semiconductor device to enable current flow from the first input node to charge the first capacitor.

11. The method of claim 1, wherein the first charge voltage is substantially the same as the first input voltage due to substantially no voltage loss across the first semiconductor device.

12. The method of claim 1, wherein the first voltage output is substantially the same as the first boost voltage due to substantially no voltage loss across the second semiconductor device.

13. A hybrid charge pump, comprising:
    a first multi-phase circuit comprising a first semiconductor device, a second semiconductor device, a first input node, and a first capacitor, the first semiconductor device comprising a depletion-mode n-channel device, and the second semiconductor device comprising an enhancement-mode p-channel device;
    a second multi-phase circuit comprising a third semiconductor device, a fourth semiconductor device, a second input node, and a second capacitor; and
    an output node,
    wherein the first multi-phase circuit is configured perform a first charge phase and a first boost phase during alternating phases of a clock signal and the second multi-phase circuit is configured perform a second charge phase and a second boost phase during alternating phases of the clock signal, and wherein, during the first boost phase, the first multi-phase circuit is configured to provide a first output voltage to the output node, the first output voltage being based on a first charge voltage stored in the first capacitor and a first boost voltage applied to the first capacitor, and wherein, during the second boost phase, the second multi-phase circuit is configured to provide a second output voltage to the output node, the second output voltage being based on a second charge voltage stored in the second capacitor and a second boost voltage applied to the second capacitor.

14. The hybrid charge pump of claim 13, wherein, during the first charge phase, the first semiconductor device is activated to provide a first current path for charging the first capacitor to the first charge voltage based on a first input voltage at the first input node, and wherein during the second charge phase, the third semiconductor device is activated to provide a second current path for charging the second capacitor to the second charge voltage based on a second input voltage at the second input node.

15. The hybrid charge pump of claim 14, wherein the first semiconductor device and the third semiconductor device are each a depletion-mode n-channel metal-oxide-semiconductor (NMOS) transistor activated in response to application of a non-negative gate-source voltage, and wherein the first charge voltage is substantially the same as the first input voltage and the second charge voltage is substantially the same as the second input voltage.

16. The hybrid charge pump of claim 14, wherein the second semiconductor device and the fourth semiconductor device are each an enhancement-mode p-channel metal-oxide-semiconductor (PMOS) transistor activated in response to application of a negative gate-source voltage, and wherein the first output voltage is substantially the same as the sum of the first boost voltage and the first charge voltage and the second output voltage is substantially the same as the sum of the second boost voltage and the second charge voltage.

17. A hybrid charge pump, comprising:
a first depletion-mode NMOS device configured to charge a first capacitor based on a first input node voltage;
a first enhancement-mode PMOS device configured to generate an output voltage based on a sum of a charge of the first capacitor and a second input node voltage;
a second depletion-mode NMOS device configured to charge a second capacitor based on a third input node voltage;
a second enhancement-mode PMOS device configured to generate the output voltage based on a sum a charge of the second capacitor and a fourth input node voltage.

18. The hybrid charge pump of claim 17, further comprising control logic configured to:
open the second enhancement-mode PMOS device to prevent a back current through the second enhancement-mode PMOS device;
provide the second input node voltage as a first boost voltage to the first capacitor after the second enhancement-mode PMOS device is opened; and
close the first enhancement-mode PMOS device after the first boost voltage is provided to the first capacitor.

19. The hybrid charge pump of claim 17, further comprising control logic configured to:
open the first enhancement-mode PMOS device to prevent a back current through the first enhancement-mode PMOS device;
provide the first input node voltage as a second boost voltage to the second capacitor after the first enhancement-mode PMOS device is opened; and
close the second enhancement-mode PMOS device after the second boost voltage is provided to the second capacitor.

20. The hybrid charge pump of claim 17, wherein the output voltage is generated according to a clocking scheme in response to which the first and second enhancement-mode PMOS devices are opened and closed and the first and second capacitors are charged.

* * * * *